(12) United States Patent
Kobayashi et al.

(10) Patent No.: US 11,474,143 B2
(45) Date of Patent: Oct. 18, 2022

(54) TESTING APPARATUS

(71) Applicant: DISCO CORPORATION, Tokyo (JP)

(72) Inventors: Makoto Kobayashi, Tokyo (JP); Okito Umehara, Tokyo (JP); Yoshinobu Saito, Tokyo (JP); Yusaku Ito, Tokyo (JP); Hirohide Yano, Tokyo (JP); Kazunari Tamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 337 days.

(21) Appl. No.: 16/707,459

(22) Filed: Dec. 9, 2019

(65) Prior Publication Data

US 2020/0182923 A1 Jun. 11, 2020

(30) Foreign Application Priority Data

Dec. 10, 2018 (JP) .............................. JP2018-231042

(51) Int. Cl.
*G01R 31/26* (2020.01)
*H01L 21/677* (2006.01)
*H01L 21/687* (2006.01)

(52) U.S. Cl.
CPC ...... *G01R 31/2601* (2013.01); *H01L 21/6773* (2013.01); *H01L 21/68757* (2013.01)

(58) Field of Classification Search
CPC .............. G01R 31/26; G01R 31/2601; G01R 31/2642; G01R 31/2648; G01R 31/2831; G01R 31/31702; H01L 21/677; H01L 21/687; H01L 21/67092; H01L 21/67132; H01L 21/67144; H01L 21/67253; H01L 21/67288; H01L 21/6773; H01L 21/68757; H01L 23/04
USPC .................................................... 324/750.25
See application file for complete search history.

(56) References Cited

U.S. PATENT DOCUMENTS

2012/0289060 A1* 11/2012 Harada ............... H01L 21/0217
438/759

FOREIGN PATENT DOCUMENTS

| JP | 09229838 A | | 9/1997 | |
| JP | 2003185808 A | * | 7/2003 | |
| JP | 2017163121 A | * | 9/2017 | ............. H01L 21/52 |

OTHER PUBLICATIONS

JP6705668B2 Die Bonding Device and Manufacturing Method of Semiconductor Device 2 (Year: 2017).*
Espacent English Translation JP2003185808A (Year: 2003).*

* cited by examiner

*Primary Examiner* — Jermele M Hollington
*Assistant Examiner* — Courtney G McDonnough
(74) *Attorney, Agent, or Firm* — Greer Burns & Crain, Ltd.

(57) ABSTRACT

A testing apparatus for measuring a strength of a chip includes: a cassette mounting base on which to mount a cassette capable of accommodating wafer units; a frame fixing mechanism that fixes an annular frame of the wafer unit; a conveying mechanism that conveys the wafer unit between the cassette and the frame fixing mechanism; a pushing-up mechanism that pushes up a predetermined chip included in the wafer supported by the annular frame fixed by the frame fixing mechanism; a pick-up mechanism having a collet picking up the chip pushed up by the pushing-up mechanism; a strength measuring mechanism having a support unit supporting the chip picked up by the collet; and a collet moving mechanism that moves the collect from a position facing the pushing-up mechanism to a position facing the support unit.

16 Claims, 16 Drawing Sheets

TESTING APPARATUS

BACKGROUND OF THE INVENTION

Field of the Invention

The present invention relates to a testing apparatus for measuring a strength of a chip.

Description of the Related Art

By dividing a semiconductor wafer formed with a plurality of devices such as integrated circuits (ICs) and large scale integrations (LSIs), a plurality of chips each including the device are manufactured. The chips are incorporated in various electronic apparatuses represented by mobile phones and personal computers.

For dividing the semiconductor wafer, there is used, for example, a cutting apparatus including a chuck table that holds the semiconductor wafer, and a cutting unit equipped with an annular cutting blade for cutting the semiconductor wafer. The cutting blade is rotated and is made to cut into the semiconductor wafer, whereby the semiconductor wafer is cut and divided into a plurality of chips. In addition, in recent years, attendant on reductions in size and thickness of electronic apparatus, the chips also have come to be required to be reduced in thickness. In view of this requirement, a technique of thinning the semiconductor wafer by grinding it before division has been used. For grinding the semiconductor wafer, there is used, for example, a grinding apparatus including a chuck table that holds the semiconductor wafer, and a grinding unit equipped with a grinding wheel including a grindstone for grinding the semiconductor wafer.

When a semiconductor wafer is processed by use of the cutting apparatus or the grinding apparatus mentioned above, processing strain (cutting strain, grinding strain, etc.) may be formed in the semiconductor wafer. If the processing strain is left in the chips obtained by dividing the semiconductor wafer, the strength of the chips is lowered, and the chips are liable to be broken. Therefore, the processing conditions for the semiconductor wafer are set in such a manner that the strength of the chips is maintained to be equal to or higher than a predetermined level.

The strength of the chips is measured, for example, by a three-point bending test. The three-point bending test is a technique in which a central portion of the chip is pressed by an indenter in a state in which both ends of the chip are supported, and the load exerted on the indenter in this instance is monitored, to thereby measure the strength of the chip. For example, Japanese Patent Laid-Open No. Hei 9-229838 discloses a testing apparatus (measuring apparatus) for measuring the strength (bending strength) of a workpiece by the three-point bending test.

SUMMARY OF THE INVENTION

When the strength of the chips is measured by use of a testing apparatus, the semiconductor wafer is divided into a plurality of chips, after which a predetermined one of the chips is manually picked up by an operator using tweezers or the like and is placed on a support base of the testing apparatus. In the case of measuring the strength of a multiplicity of chips, therefore, an operation of picking up the chips one by one and conveying the chip to the testing apparatus should be repeated multiple times, so that much labor is needed for testing the chips. Besides, where the chips are conveyed manually, variability may be generated in the operation of picking up the chip, the position at which the chip is placed, or the like. Consequently, it becomes difficult to measure the strength of the plurality of chips under the same conditions, and the accuracy of the test would be lowered.

The present invention has been made in consideration of such a problem, and it is an object of the invention to provide a testing apparatus by which chips can be tested easily and with high accuracy.

In accordance with an aspect of the present invention, there is provided a testing apparatus for measuring a strength of a chip, the testing apparatus including: a cassette mounting base on which a cassette capable of accommodating wafer units is mounted, the wafer units each having a wafer divided into a plurality of chips, a tape adhered to the wafer, and an annular frame adhered to an outer peripheral portion of the tape and provided with an opening disposing the wafer inside thereof; a frame fixing mechanism that fixes the annular frame of the wafer unit; a conveying mechanism that conveys the wafer unit between the cassette and the frame fixing mechanism; a pushing-up mechanism that pushes up a predetermined chip included in the wafer supported by the annular frame fixed by the frame fixing mechanism; a pick-up mechanism having a collet that picks up the chip pushed up by the pushing-up mechanism; a strength measuring mechanism including a support unit that supports the chip picked up by the collet, an indenter that presses the chip supported by the support unit, a moving mechanism that relatively moves the indenter closer to and away from the support unit, and a load measuring unit that measures a load exerted on the indenter when the indenter presses the chip; and a collect moving mechanism that moves the collet from a position facing the pushing-up mechanism to a position facing the support unit.

Preferably, the testing apparatus further includes a chip observation mechanism that has an imaging unit imaging the chip picked up by the collet and is disposed in a region overlapping with a moving route of the collet when the collet moves from the position facing the pushing-up mechanism to the position facing the support unit. Preferably, the imaging unit has an interference objective lens and is disposed on a vibration isolating section restraining transmission of vibration to the imaging unit. Preferably, the pick-up mechanism includes an arm that connects the collet and the collet moving mechanism, the arm includes a first support section connected to the collet moving mechanism and a second support section to which the collet is fixed, the first support section and the second support section are connectable to and separable from each other, the chip observation mechanism includes a holding section that holds the second support section, and the imaging unit images the chip held by the collet in a state in which the second support section separated from the first support section is held by the holding section.

In the testing apparatus according to the described aspect of the present invention, a predetermined chip included in the wafer is picked up by the collet, after which the collet is moved by the collet moving mechanism, whereby the chip can be placed on the support unit of the strength measuring mechanism. Therefore, the strength of the chip can be measured, without manually performing the pick-up of the chip and placement of the chip onto the strength measuring mechanism. Consequently, the test of the chips can be facilitated, and lowering in the accuracy of the test due to variability in the picking-up operation or chip placement, or the like can be prevented.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
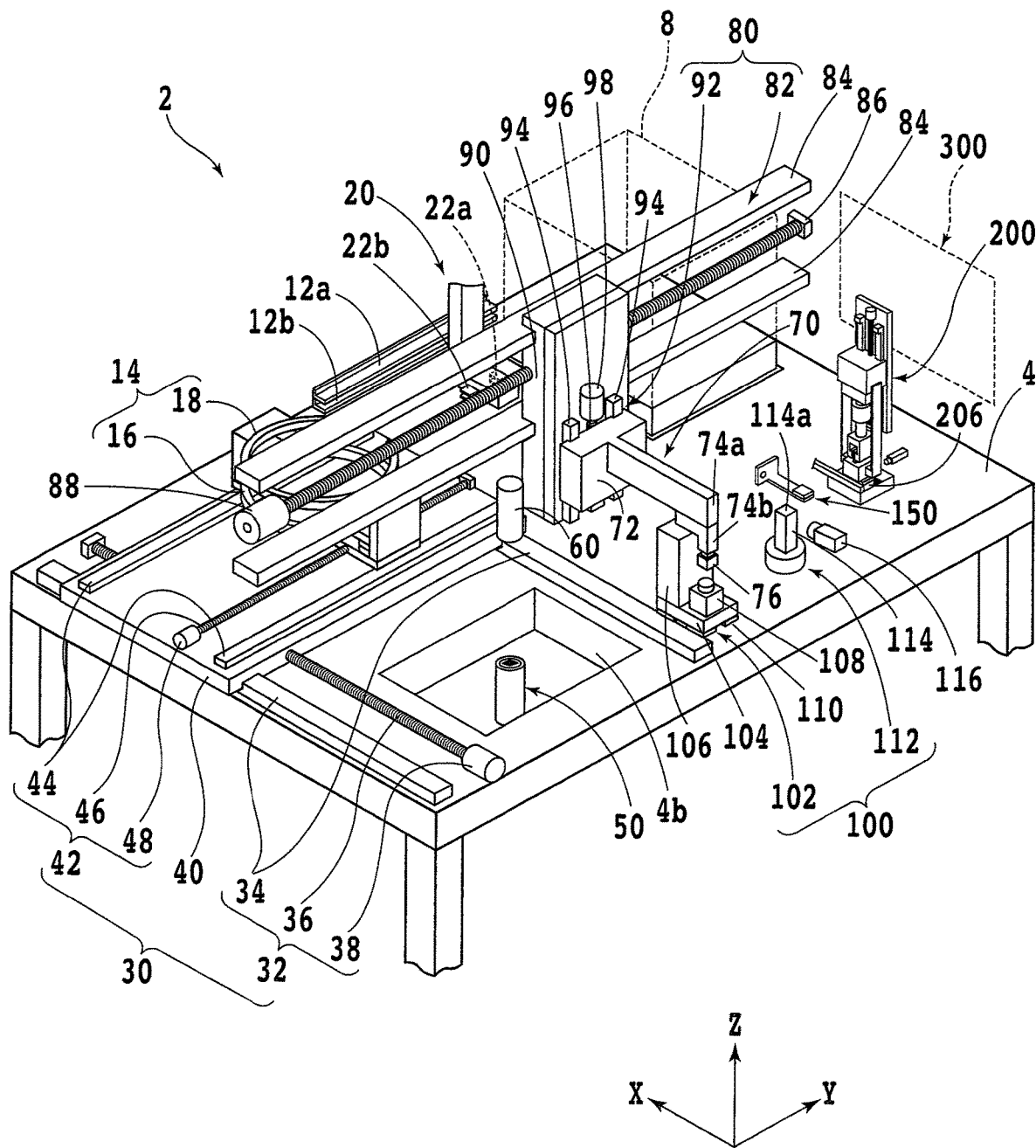
FIG. 1 is a perspective view of a testing apparatus.
Figure 2:
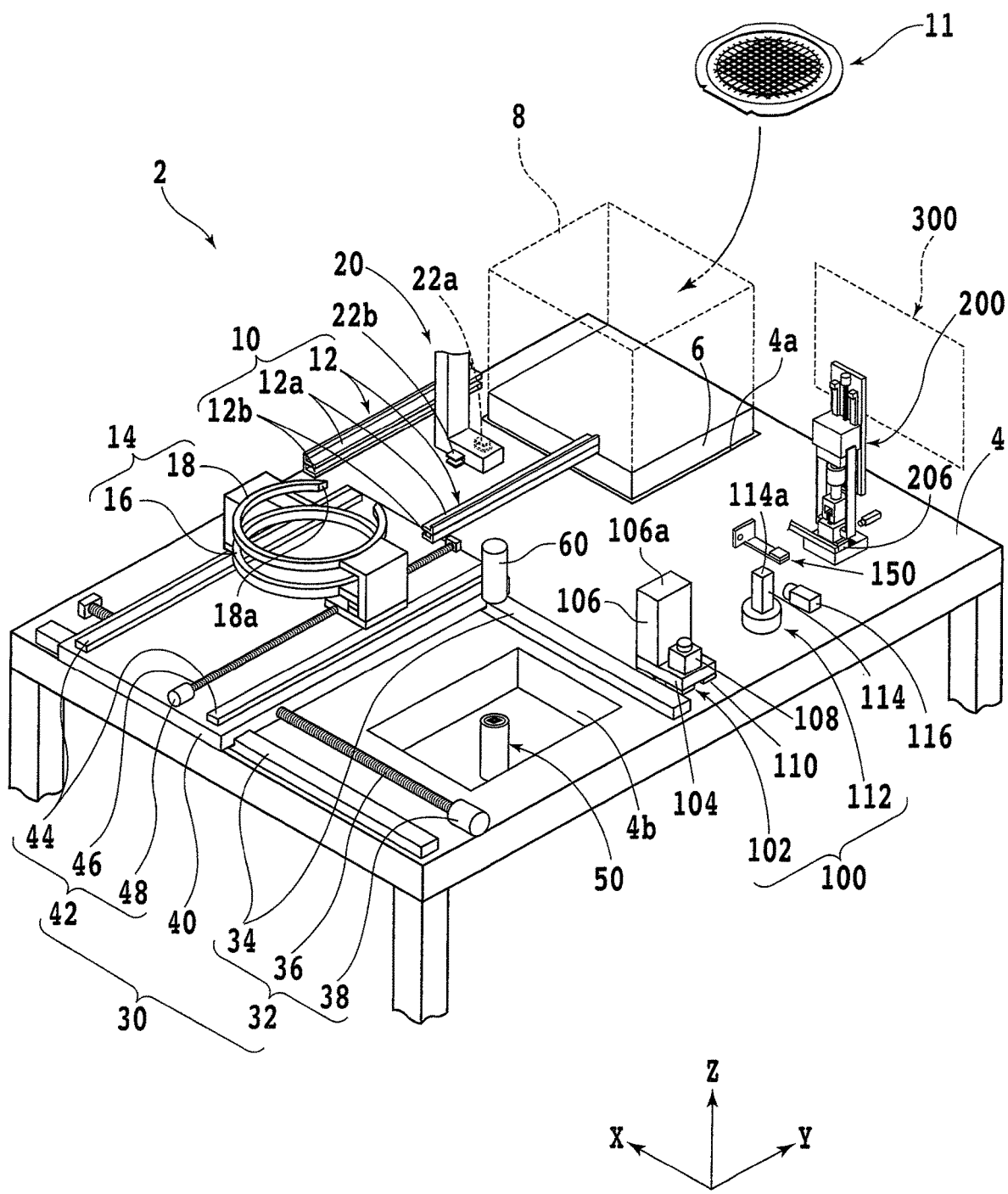
FIG. 2 is a perspective view illustrating the testing apparatus while omitting part of components of the same.

An embodiment of the present invention will be described below referring to the attached drawings. First, a configuration example of a testing apparatus according to the embodiment will be described. FIG. 1 is a perspective view of a testing apparatus 2 for measuring the strength of a chip. FIG. 2 is a perspective view depicting the testing apparatus 2 while omitting part of the components (a pick-up mechanism 70 and a collet moving mechanism 80 described later).

The testing apparatus 2 includes a base 4 that supports each of the components constituting the testing apparatus 2. As illustrated in FIG. 2, a rectangular opening 4a is provided on one end side on the front side (right upper side in FIGS. 1 and 2) of the base 4, and a cassette mounting base 6 lifted up and down by a lift mechanism (not illustrated) is disposed in the inside of the opening 4a. A cassette 8 capable of accommodating a plurality of wafer unit 11 is mounted on an upper surface of the cassette mounting base 6. Note that the outline of the cassette 8 is indicated by broken line in FIGS. 1 and 2.

Figure 3:
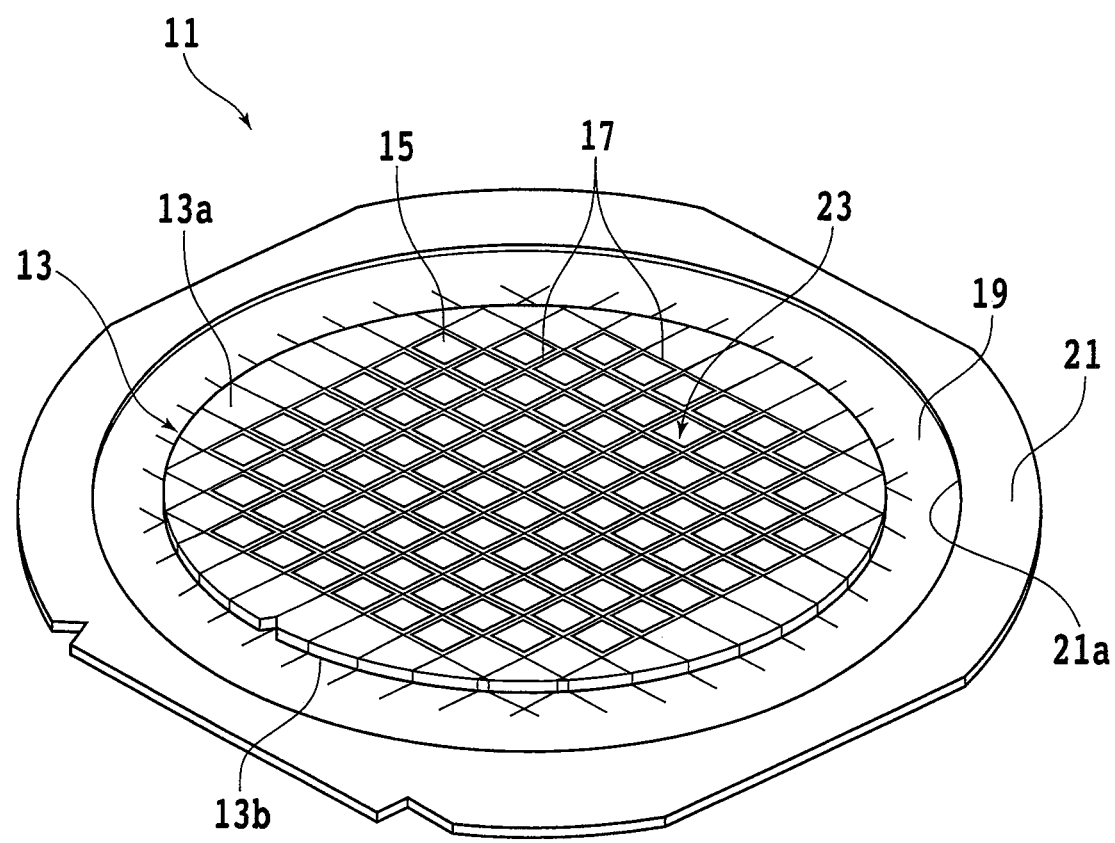
FIG. 3 is a perspective view of a wafer unit.

FIG. 3 is a perspective view of the wafer unit 11. The wafer unit 11 includes a wafer 13 which is formed in a disk-like shape using a material such as silicon, for example, and has a front surface 13a and a back surface 13b. A plurality of devices 15 including an IC, an LSI, a light emitting diode (LED) or the like are formed on the front surface 13a side of the wafer 13. In addition, the wafer 13 is partitioned into a plurality of regions by a plurality of streets 17 arranged in a grid pattern such as to intersect each other. The plurality of devices 15 are formed respectively on the front surface 13a side of each of the regions partitioned by the streets 17. Note that the material, shape, structure, size and the like of the wafer 13 are not limited. For example, the wafer 13 may be a substrate formed of a material such as other semiconductors (SiC, GaAs, InP, GaN, etc.) than silicon, sapphire, glass, ceramics, resins, or metals. In addition, the kind, number, shape, structure, size, layout and the like of the devices 15 are also not limited.

A circular tape 19 is adhered to the back surface 13b side of the wafer 13. For example, the tape 19 includes a flexible tape in which a rubber-based or acrylic adhesive layer (glue layer) is formed on a base material of a resin such as polyolefin, polyvinyl chloride, or polyethylene terephthalate. Note that the diameter of the tape 19 is greater than the diameter of the wafer 13, and the wafer 13 is adhered to a central portion of the tape 19. In addition, an annular frame 21 including a metal or the like and provided in its central portion with a circular opening 21a is adhered to an outer peripheral portion of the tape 19. By this, the wafer 13 is supported by the annular frame 21 through the tape 19, in a state of being disposed in the inside of the opening 21a.

The wafer 13 is cut along the streets 17, to be divided into a plurality of chips 23 provided with the devices 15 respectively. For the division of the wafer 13, there is used, for example, a cutting apparatus including a chuck table that holds the wafer 13, and a cutting unit equipped with an annular cutting blade that cuts the wafer 13. With the cutting blade rotated and made to cut into the wafer 13 along the streets 17, the wafer 13 is cut and divided into the plurality of chips 23. It is to be noted, however, that the method for dividing the wafer is not limited.

Note that the plurality of chips 23 are each peeled off from the tape 19 in a later step. Therefore, the tape 19 preferably has a property of being lowered in adhesive force when subjected to a predetermined treatment. As the tape 19, there can be used, for example, an ultraviolet (UV)-curing type tape which is cured when irradiated with UV rays. Besides, as the tape 19, there may be used a tape in which microcapsules expandable by irradiation with UV rays or a foaming agent capable of foaming when irradiated with UV rays is contained in the adhesive layer. When such a tape 19 is irradiated with UV rays, the adhesive force of the tape 19 for adhesion to the chips 23 is lowered.

As above-mentioned, the wafer 13 divided into the plurality of chips 23, the tape 19, and the annular frame 21 constitute the wafer unit 11. The tape 19 with the plurality of chips 23 adhered thereto is subjected to a treatment such as irradiation with UV rays, as required, after which the plurality of wafer units 11 are accommodated into the cassette 8 illustrated in FIGS. 1 and 2.

In addition, as depicted in FIG. 2, a tentative placing mechanism (tentative placing means) 10 by which the wafer unit 11 is tentatively placed is provided on the rear side (the left lower side in FIGS. 1 and 2) of the cassette mounting base 6. The tentative placing mechanism 10 includes a pair of guide rails 12 disposed in parallel to each other. The pair of guide rails 12 include first support surfaces 12a and second support surfaces 12b which are substantially parallel to an X-axis direction (first horizontal direction; left-right direction) and a Y-axis direction (second horizontal direction; front-rear direction), respectively. The first support surfaces 12a are disposed on the upper side of the second support surfaces 12b such as to overlap with the second support surfaces 12b. The pair of first support surfaces 12a and the pair of second support surfaces 12b support the lower surface side of end portions (annular frame 21) of the wafer unit 11. For example, the pair of first support surfaces 12a support the wafer unit 11 conveyed from the cassette 8, whereas the pair of second support surfaces 12b support the wafer unit 11 conveyed from a frame fixing mechanism 14 to be described later.

The frame fixing mechanism (frame fixing means) 14 for fixing the annular frame 21 of the wafer unit 11 is provided on the rear side of the tentative placing mechanism 10. The frame fixing mechanism 14 includes a frame support section 16 that supports the lower surface side of the annular frame 21, and a frame presser section 18 that is disposed on the upper side of the frame support section 16 and makes contact with the upper surface side of the annular frame 21. The frame support section 16 and the frame presser section 18 are each formed in an annular shape corresponding to the shape of the annular frame 21, and are disposed to overlap with each other.

The frame support section 16 is configured to be movable along a Z-axis direction (vertical direction; up-down direction). When the frame support section 16 is moved upward in a state in which the wafer unit 11 is disposed such that the annular frame 21 is supported by the frame support section 16, the annular frame 21 is fixed by being clamped between the frame support section 16 and the frame presser section 18. Note that whether or not the annular frame 21 is being appropriately fixed by the frame fixing mechanism 14 can be confirmed, for example, by detecting whether or not the frame support section 16 and the frame presser section 18 are in conduction with each other through the annular frame 21.

Besides, a conveying mechanism (conveying means) 20 for conveying the wafer unit 11 between the cassette 8 and the frame fixing mechanism 14 is provided on the upper side of the tentative placing mechanism 10 and the frame support section 16. The conveying mechanism 20 is configured to be movable along the Y-axis direction and the Z-axis direction, and includes a first grasping section 22a and a second grasping section 22b which grasp the annular frame 21 of the wafer unit 11 from upper and lower sides. Note that the first grasping section 22a is provided on the cassette 8 side of the conveying mechanism 20, while the second grasping section 22b is provided on the frame fixing mechanism 14 side of the conveying mechanism 20.

When conveying the wafer unit 11 out of the cassette 8, the conveying mechanism 20 is moved along the Y-axis direction toward the tentative placing mechanism 10 side in a state in which an end portion of the wafer unit 11 accommodated in the cassette 8 is grasped by the first grasping section 22a. By this, the wafer unit 11 is drawn out of the cassette 8, and is disposed on the pair of first support surfaces 12a possessed by the tentative placing mechanism 10. Thereafter, the grasping by the first grasping section 22a is released. Next, in a state in which an end portion on the cassette 8 side of the wafer unit 11 is grasped by the second grasping section 22b of the conveying mechanism 20, the conveying mechanism 20 is moved along the Y-axis direction toward the frame fixing mechanism 14 side. By this, the wafer unit 11 is conveyed to a position between the frame support section 16 and the frame presser section 18, and the annular frame 21 is supported by the frame support section 16. Note that a cutout 18a (see FIG. 2) formed by cutting out the frame presser section 18 is provided on the tentative placing mechanism 10 side of the frame presser section 18. This cutout 18a is formed in such a size that the conveying mechanism 20 can pass therethrough. As a result, when the wafer unit 11 is conveyed to the frame fixing mechanism 14, the conveying mechanism 20 can be prevented from making contact with the frame presser section 18. Thereafter, grasping by the second grasping section 22b is released, and the frame support section 16 is moved upward. By this, the annular frame 21 is fixed by being clamped between the frame support section 16 and the frame presser section 18.

The frame fixing mechanism 14 is connected to a positioning mechanism (positioning means) 30 that controls the position of the frame fixing mechanism 14. The positioning mechanism 30 includes an X-axis moving mechanism 32 that moves the frame fixing mechanism 14 along the X-axis direction, and a Y-axis moving mechanism 42 that moves the frame fixing mechanism 14 along the Y-axis direction. The position in horizontal directions of the frame fixing mechanism 14 is controlled by the X-axis moving mechanism 32 and the Y-axis moving mechanism 42.

The X-axis moving mechanism 32 includes a pair of guide rails 34 disposed on the base 4 along the X-axis direction. Between the pair of guide rails 34, a ball screw 36 is provided which is disposed substantially in parallel to the pair of guide rails 34. A pulse motor 38 for rotating the ball screw 36 is connected to one end portion of the ball screw 36. On the pair of guide rails 34, a moving block 40 is slidably disposed. A nut section (not illustrated) is provided on the lower surface side (back surface side) of the moving block 40, and the nut section is in screw engagement with the ball screw 36. When the ball screw 36 is rotated by the pulse motor 38, the moving block 40 is moved in the X-axis direction along the pair of guide rails 34.

The Y-axis moving mechanism 42 includes a pair of guide rails 44 disposed on the moving block 40 along the Y-axis direction. Between the pair of guide rails 44, a ball screw 46 is provided which is disposed substantially in parallel to the pair of guide rails 44. A pulse motor 48 for rotating the ball screw 46 is connected to one end portion of the ball screw 46. On the pair of guide rails 44, the frame fixing mechanism 14 is slidably disposed. A nut section (not illustrated) is provided on the lower surface side of the frame fixing mechanism 14, and this nut section is in screw engagement with the ball screw 46. When the ball screw 46 is rotated by the pulse motor 48, the frame fixing mechanism 14 is moved in the Y-axis direction along the pair of guide rails 44.

In addition, the base 4 is provided, in a region interposed between the pair of guide rails 34, with a rectangular opening 4b. A cylindrical pushing-up mechanism (pushing-up means) 50 that pushes the chip 23 (see FIG. 3) included in the wafer 13 of the wafer unit 11 upward from the lower surface side is provided inside the opening 4b. The pushing-up mechanism 50 is connected to a lift mechanism (not illustrated) including an air cylinder or the like, and is lifted up and down along the Z-axis direction. When the frame fixing mechanism 14 is moved along the X-axis direction by the positioning mechanism 30 in a state in which the annular frame 21 of the wafer unit 11 is fixed by the frame fixing mechanism 14, the wafer unit 11 is positioned over the opening 4b. Then, the predetermined chip 23 (see FIG. 3) included in the wafer 13 is pushed upward by the pushing-up mechanism 50.

Figure 4A:
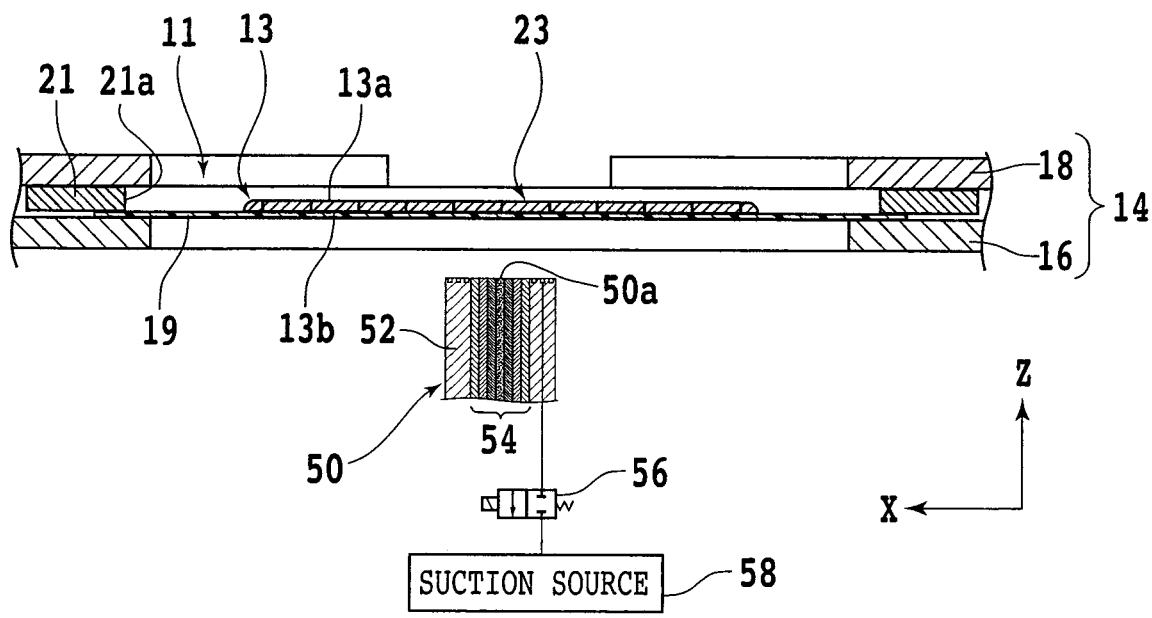
FIG. 4A is a sectional view depicting the wafer unit disposed on a pushing-up mechanism.
Figure 4B:
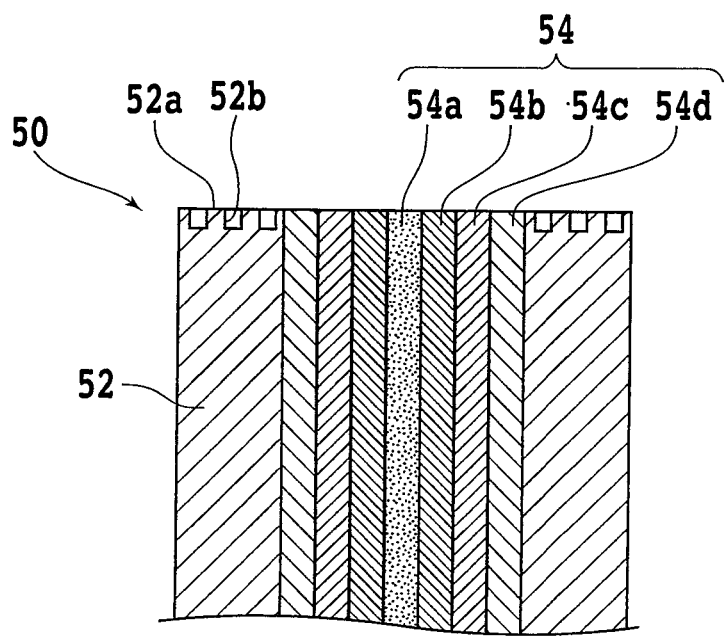
FIG. 4B is a sectional view depicting, in an enlarged form, part of the pushing-up mechanism.

FIG. 4A is a sectional view depicting the wafer unit 11 disposed over the pushing-up mechanism 50. The pushing-up mechanism 50 includes an outer layer section 52 formed in a hollow cylindrical shape, and a tetragonal prismatic pushing-up section 54 disposed inside the outer layer section 52. FIG. 4B is a sectional view depicting part of the pushing-up mechanism 50 in an enlarged form. A plurality of suction grooves 52b formed in concentric shapes along the circumferential direction of the outer layer section 52 are provided on an upper surface 52a side of the outer layer section 52. The suction grooves 52b are respectively connected to a suction source 58, configured using an ejector or the like, through a suction path (not illustrated) formed inside the pushing-up mechanism 50 and a valve 56. The pushing-up section 54 includes a first push-up pin 54a formed in a tetragonal prismatic shape, a second push-up pin 54b formed in a hollow tetragonal prismatic shape and surrounding the first push-up pin 54a, a third push-up pin 54c formed in a hollow tetragonal prismatic shape and surrounding the second push-up pin 54b, and a fourth push-up pin 54d formed in a hollow tetragonal prismatic shape and surrounding the third push-up pin 54c. The first push-up pin 54a, the second push-up pin 54b, the third push-up pin 54c, and the fourth push-up pin 54d are each connected to a lift mechanism (not illustrated) including a motor or the like, and are lifted up and down along the Z-axis direction.

When the pushing-up mechanism 50 is moved upward in a state in which the wafer unit 11 is positioned on the pushing-up mechanism 50, the chip 23 disposed at a position for overlapping with the pushing-up mechanism 50 is pushed up. Note that the size of the pushing-up mechanism 50 is appropriately controlled according to the size of the chip 23. Alignment between the chip 23 and the pushing-up mechanism 50 is performed by controlling the position of the frame fixing mechanism 14 by the positioning mechanism 30 (see FIGS. 1 and 2). For this alignment, a wafer imaging camera 60 (see FIGS. 1 and 2) disposed on an upper side of the pushing-up mechanism 50 is used.

The wafer imaging camera 60 is disposed at such a position as to be able to image the whole part of the wafer 13 (see FIG. 3) disposed over the opening 4b. Based on an image of the wafer 13 acquired by the wafer imaging camera 60, the position of the frame fixing mechanism 14 is controlled such that a predetermined chip 23 overlaps with the pushing-up mechanism 50. Note that a light for illuminating the wafer 13 is preferably provided in the vicinity of the pushing-up mechanism 50. At the time of imaging the wafer 13 by the wafer imaging camera 60, the wafer 13 is illuminated, whereby a clear image can be obtained. Note that the position where to provide the light is not limited. For example, the light is provided at a bottom portion of the opening 4b such as to be adjacent to the pushing-up mechanism 50. In addition, the pushing-up mechanism 50 may be formed using a transparent material, and the light may be provided inside the pushing-up mechanism 50.

The chip 23 pushed up by the pushing-up mechanism 50 is picked up by a pick-up mechanism (pick-up means) 70 depicted in FIG. 1. The pick-up mechanism 70 includes a collet 76 for picking up the chip 23 pushed up by the pushing-up mechanism 50, and is connected to a collet moving mechanism (collet moving means) 80 that controls the position of the collet 76.

Figure 5:
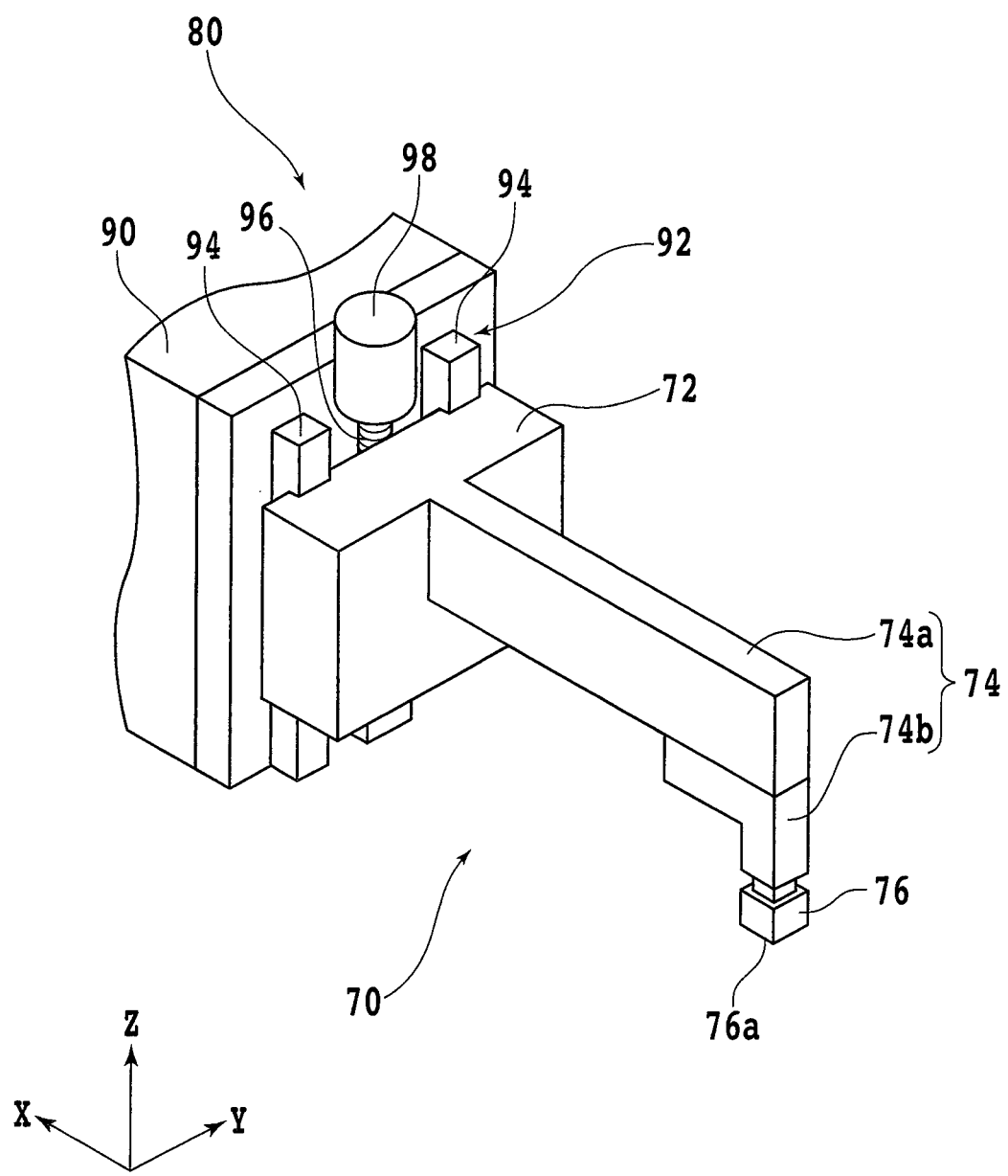
FIG. 5 is a perspective view of a pick-up mechanism.

FIG. 5 is a perspective view of the pick-up mechanism 70. The pick-up mechanism 70 includes a moving base 72 connected to the collet moving mechanism 80, and a columnar arm 74 which is disposed to extend along the X-axis direction from the moving base 72 toward the opposite side of the collet moving mechanism 80 and which connects the collet 76 and the collet moving mechanism 80. The arm 74 includes a columnar first support section 74a connected to the collet moving mechanism 80 through the moving base 72, and a second support section 74b projecting downward from a tip portion of the first support section 74a. Note that the first support section 74a and the second support section 74b are configured to be connectable to and separable from each other. For example, the first support section 74a and the second support section 74b are connected such as to be attachable to and detachable from each other by a tool changer or the like.

The collet 76 for holding the chip 23 is fixed to a lower end side of the second support section 74b. A lower surface of the collet 76 constitutes a suction surface 76a for suction holding the chip 23. The suction surface 76a is connected to a suction source (not illustrated) through a suction path (not illustrated) formed inside the collet 76. When a negative pressure of the suction source is made to act on the suction surface 76a of the collet 76 in a state in which the chip 23 is put in contact with the suction surface 76a, the chip 23 is suction held by the collet 76.

The pick-up mechanism 70 is connected to the collet moving mechanism 80. As illustrated in FIG. 1, the collet moving mechanism 80 includes a Y-axis moving mechanism 82 that moves the pick-up mechanism 70 along the Y-axis direction, and a Z-axis moving mechanism 92 that moves the pick-up mechanism 70 along the Z-axis direction. The position of the collet 76 in the Y-axis direction and the Z-axis direction is controlled by the Y-axis moving mechanism 82 and the Z-axis moving mechanism 92.

The Y-axis moving mechanism 82 includes a pair of guide rails 84 disposed along the Y-axis direction. Between the pair of guide rails 84, a ball screw 86 is provided which is disposed substantially in parallel to the pair of guide rails 84. A pulse motor 88 for rotating the ball screw 86 is connected to one end portion of the ball screw 86. A moving block 90 is slidably mounted to the pair of guide rails 84. In addition, the moving block 90 is provided with a nut section (not illustrated), and the nut section is in screw engagement with the ball screw 86. When the ball screw 86 is rotated by the pulse motor 88, the moving block 90 is moved in the Y-axis direction along the pair of guide rails 84.

The Z-axis moving mechanism 92 includes a pair of guide rails 94 disposed on a side surface of the moving block 90 along the Z-axis direction. Between the pair of guide rails 94, a ball screw 96 is provided which is disposed substantially in parallel to the pair of guide rails 94. A pulse motor 98 for rotating the ball screw 96 is connected to one end portion of the ball screw 96. The moving base 72 of the pick-up mechanism 70 is slidably mounted to the pair of guide rails 94. In addition, the moving base 72 is provided with a nut section (not illustrated), and the nut section is in screw engagement with the ball screw 96. When the ball screw 96 is rotated by the pulse motor 98, the moving base 72 is moved in the Z-axis direction along the pair of guide rails 94.

The chip 23 pushed up by the pushing-up mechanism 50 is picked up by the collet 76 of the pick-up mechanism 70. An example of operations of the pushing-up mechanism 50 and the collet 76 at the time of picking up a predetermined chip 23 from the wafer 13 will be described below.

First, the wafer unit 11 fixed by the frame fixing mechanism 14 is moved by the positioning mechanism 30, to be disposed above the pushing-up mechanism 50 (see FIG. 4A). In addition, based on an image acquired by the wafer imaging camera 60, the position of the frame fixing mechanism 14 is controlled such that the predetermined chip 23 to be picked up and the pushing-up mechanism 50 overlap with each other. Note that in this instance, the collet 76 is disposed at a position for facing (position for overlapping with) an upper surface 50a of the pushing-up mechanism 50 (see FIG. 6A).

Figure 6A:
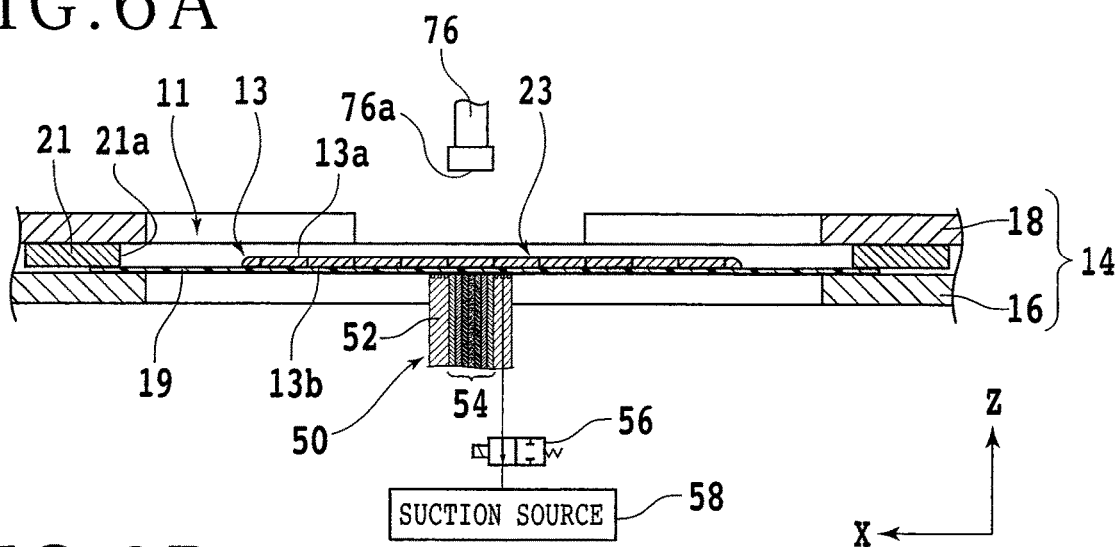
FIG. 6A is a sectional view depicting the wafer unit in a state in which a tape is sucked by the pushing-up mechanism.

Next, the pushing-up mechanism 50 is moved upward, and the upper surface 50a of the pushing-up mechanism 50 is put into contact with the tape 19 adhered to the back surface side of the chip 23. In this state, the valve 56 is opened, to cause the negative pressure of the suction source 58 to act on the upper surface 52a of the outer layer section 52 through the suction grooves 52b (see FIG. 4B). As a result, that region of the tape 19 which makes contact with the pushing-up mechanism 50 is sucked. FIG. 6A is a sectional view depicting the wafer unit 11 in a state in which the tape 19 is sucked by the pushing-up mechanism 50.

Figure 6B:
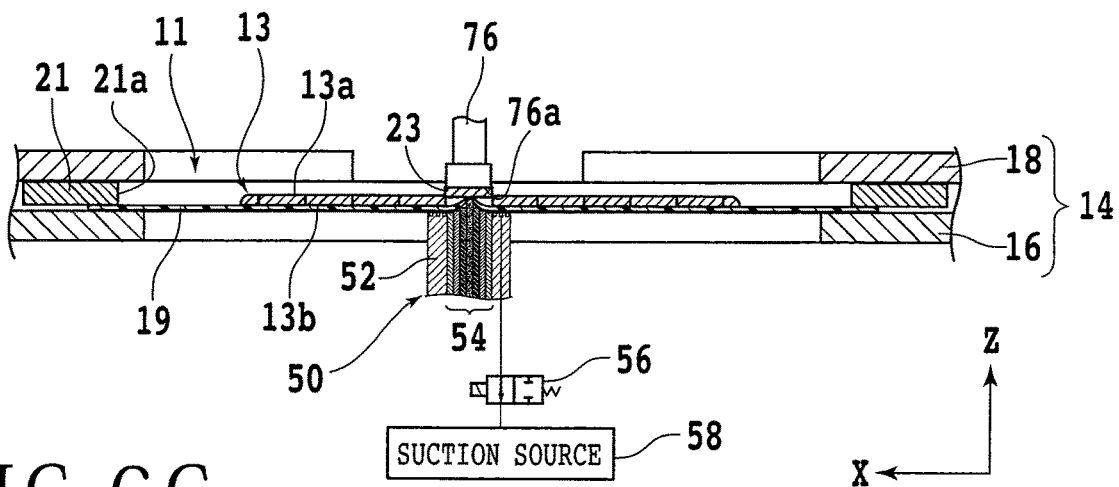
FIG. 6B is a sectional view depicting the wafer unit in which a chip is pushed up by the pushing-up mechanism.

Subsequently, the pushing-up section 54 of the pushing-up mechanism 50 is moved upward, to push upward the lower surface side of the chip 23, with the tape 19 interposed therebetween. In this instance, the first push-up pin 54a, the second push-up pin 54b, the third push-up pin 54c, and the fourth push-up pin 54d (see FIG. 4B) constituting the pushing-up section 54 are moved in such a manner that their upper ends are disposed on an upper position as being located nearer to the center of the pushing-up mechanism 50. FIG. 6B is a sectional view depicting the wafer unit 11 in a state in which the chip 23 is pushed up by the pushing-up mechanism 50. As illustrated in FIG. 6B, the chip 23 pushed up by the pushing-up mechanism 50 is in a state of being disposed above the other chips 23.

Figure 6C:
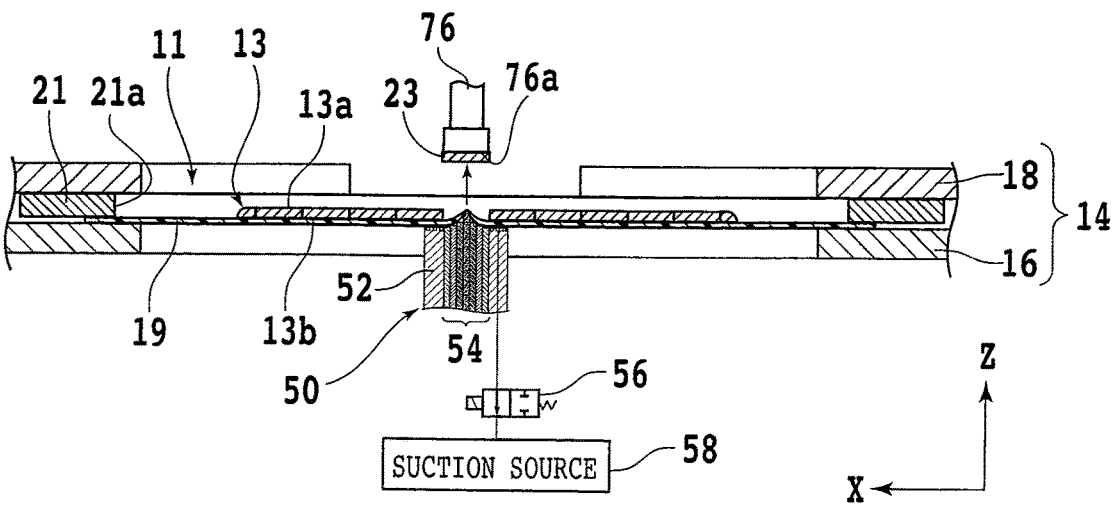
FIG. 6C is a sectional view depicting the wafer unit in a state in which the chip is picked up by a collet.

Next, the pick-up mechanism 70 is moved downward, and the suction surface 76a of the collet 76 disposed such as to overlap with the chip 23 pushed up is brought into contact with the upper surface side of the chip 23 pushed up by the pushing-up mechanism 50. In the state in which the suction surface 76a of the collet 76 and the chip 23 are in contact with each other, a negative pressure is made to act on the suction surface 76a. As a result, the chip 23 is suction held by the collet 76. When the pick-up mechanism 70 is moved upward in this state, the chip 23 is peeled off from the tape 19, and is picked up by the collet 76. FIG. 60 is a sectional view of the wafer unit 11 in the state in which the chip 23 is picked up by the collet 76. As illustrated in FIG. 6C, the predetermined chip 23 is picked up from the wafer 13 by the collet 76.

Note that in the case where the tape 19 has a property of being lowered in adhesive force when irradiated with UV rays, a light source for irradiation with UV rays may be provided on the upper surface 50a side of the pushing-up mechanism 50. In this case, at the time of bringing the pushing-up mechanism 50 into contact with the tape 19 (see FIG. 6A), only that region of the tape 19 which is located on the lower side of the chip 23 to be picked up is irradiated with UV rays, whereby the adhesive force of the tape 19 can be partially weakened. As a result, pick-up of the predetermined chip 23 is facilitated, and the layout of the other chips 23 is maintained by the adhesive force of those regions of the tape 19 which are not irradiated with UV rays.

Besides, a load cell for measuring the load exerted on the chip 23 may be provided on the upper surface 50a side of the pushing-up mechanism 50 or on the suction surface 76a side of the collet 76. In this case, the load exerted on the chip 23 when the chip 23 is picked up can be measured by the load cell. Based on the load measured by the load cell, it is possible, for example, to check whether or not the chip 23 has been broken when picked up, or to appropriately change picking-up conditions (the height of the collet 76 at the time of picking up the chip 23, or the like).

The wafer unit 11 after the chip 23 is picked up therefrom may be again accommodated into the cassette 8. In this case, first, the frame fixing mechanism 14 is moved to the rear side of the tentative placing mechanism 10, and fixation of the annular frame 21 by the frame fixing mechanism 14 is released. Thereafter, an end portion of the wafer unit 11 is grasped by the second grasping section 22b (see FIG. 2) of the conveying mechanism 20, and the wafer unit 11 is conveyed onto the pair of second support surfaces 12b possessed by the tentative placing mechanism 10. Then, an end portion of the wafer unit 11 is grasped by the first grasping section 22a of the conveying mechanism 20, and the wafer unit 11 is accommodated into the cassette 8.

On the other hand, the chip 23 picked up by the collet 76 is conveyed forward by the collet moving mechanism 80. As depicted in FIG. 1, a chip observation mechanism (chip observation means) 100 for observing the chip 23 picked up by the collet 76 is provided on the front side of the pushing-up mechanism 50. The chip observation mechanism 100 includes a lower surface observation mechanism 102 for observing the lower surface of the chip 23, and a side surface observation mechanism 112 for observing a side surface of the chip 23. The lower surface observation mechanism 102 and the side surface observation mechanism 112 include imaging units (cameras) for imaging the chip 23 (a lower surface imaging unit 108 and a side surface imaging unit 116 to be described later), respectively.

Figure 7A:
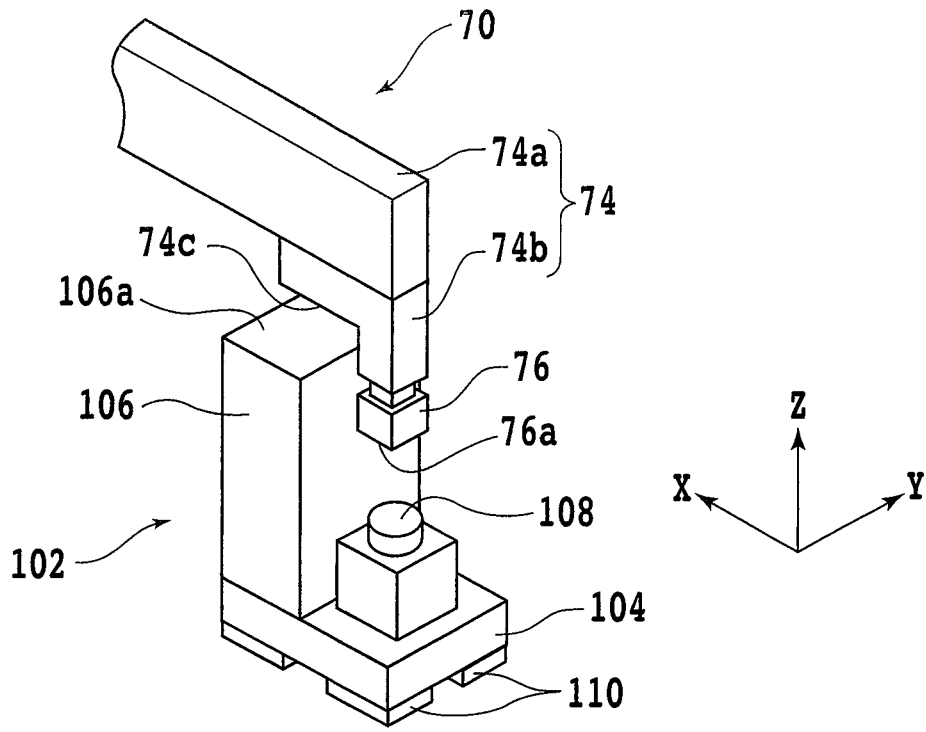
FIG. 7A is a perspective view of a lower surface observation mechanism.

FIG. 7A is a perspective view of the lower surface observation mechanism 102. The lower surface observation mechanism 102 includes a rectangular parallelepiped shaped support base 104, and a columnar support structure 106 disposed to extend from an upper surface on one end side of the support base 104 toward an upper side. Besides, the lower surface imaging unit (lower surface observation camera) 108 for imaging the lower surface of the chip 23 is provided on an upper surface on the other end side of the support base 104. In addition, a vibration isolating section (vibration isolating means) 110 including a vibration-proof material such as, for example, rubber vibration isolator is provided between the base 4 and the support base 104. The lower surface imaging unit 108 is disposed on the vibration isolating section 110. By the vibration isolating section 110, transmission of vibration from the base 4 to the lower surface imaging unit 108 is restrained.

Note that as aforementioned, the first support section 74a and the second support section 74b of the arm 74 are configured to be connectable to and separable from each other. An upper surface of the support structure 106 constitutes a holding section 106a for holding the second support section 74b separated from the first support section 74a.

Figure 7B:
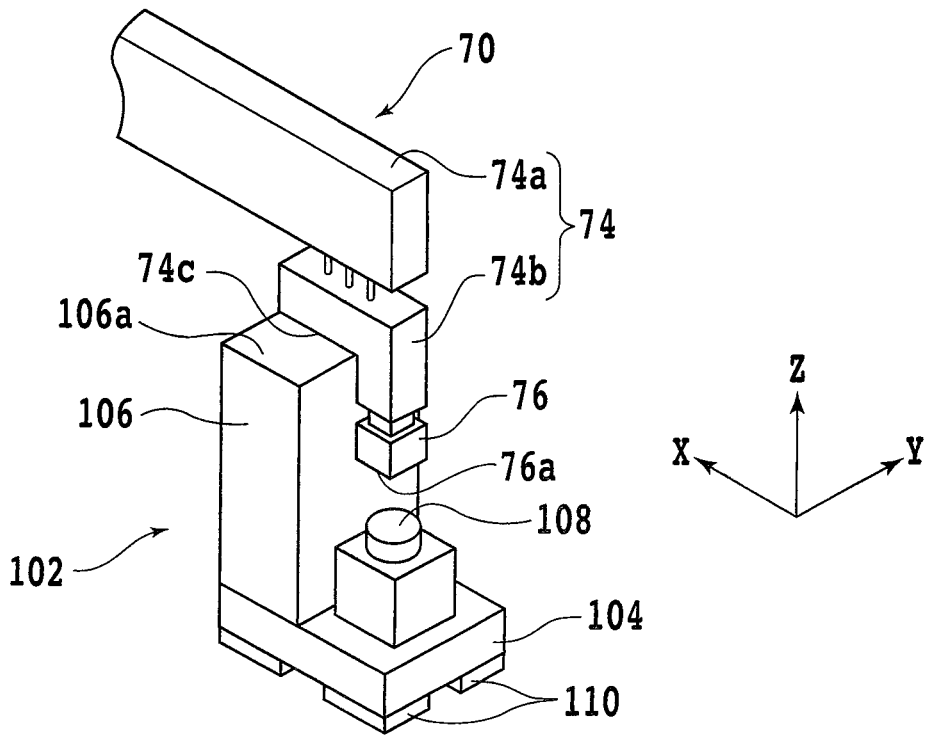
FIG. 7B is a perspective view depicting the lower surface observation mechanism holding a second support section of an arm.

FIG. 7B is a perspective view of the lower surface observation mechanism 102 holding the second support section 74b of the arm 74. As depicted in FIG. 7B, a lower surface 74c of the second support section 74b separated from the first support section 74a is supported by the holding section 106a. The holding section 106a is connected, for example, to a suction source (not illustrated), and holds the second support section 74b by sucking the lower surface 74c of the second support section 74b. It is to be noted, however, that the method for holding the second support section 74b is not limited. For example, the holding section 106a may include a magnet, and the lower surface 74c of the second support section 74b including a magnetic material may be held by a magnetic force. The lower surface imaging unit 108 images the lower surface of the chip 23 held by the collet 76, in a state in which the second support section 74b separated from the first support section 74a is held by the holding section 106a. As a result, vibration of the first support section 74a due to an operation of the collet moving mechanism 80 or the like can be prevented from being transmitted to the chip 23, and accuracy in imaging the chip 23 by the lower surface imaging unit 108 can be enhanced.

Figure 8A:
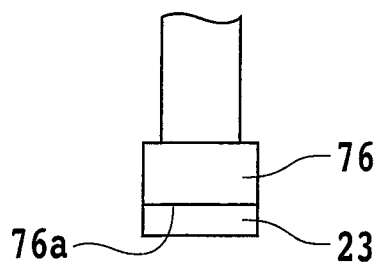
FIG. 8A is a front view of an imaging unit that images a lower surface of the chip.

FIG. 8A is a front view of the lower surface imaging unit 108 for imaging the lower surface of the chip 23. As depicted in FIG. 8A, the chip 23 is disposed such as to overlap with the lower surface imaging unit 108, and the lower surface side is imaged by the lower surface imaging unit 108. The lower surface of the chip 23 may be formed with a minute ruggedness (projection and recess) such as processing mark (saw mark) of grinding applied to the back surface 13b side of the wafer 13 (see FIG. 3) before divided, and such ruggedness influences the strength of the chip 23. Therefore, at the time of measuring the strength of the chip 23, it is preferable to preliminarily check the state of the lower surface of the chip 23. In the testing apparatus 2, the lower surface imaging unit 108 is provided in a region overlapping with the moving route of the collet 76, and, therefore, the chip 23 can be disposed on the lower surface imaging unit 108 in the state of being held by the collet 76.

In addition, as illustrated in FIGS. 1 and 2, the side surface observation mechanism 112 is provided on the front side of the lower surface observation mechanism 102. The side surface observation mechanism 112 includes a columnar chip support base 114 that supports the chip 23, and the side surface imaging unit (side surface observation camera) 116 that images a side surface of the chip 23. An upper surface of the chip support base 114 is formed to be substantially horizontal, and constitutes a support surface 114a for supporting the chip 23. Besides, the chip support base 114 is connected to a rotational drive source (not illustrated), and is rotated around a rotational axis which is substantially parallel to the Z-axis. The side surface imaging unit 116 is disposed at such a position as to be able to image a side surface of the chip 23 disposed on the support surface 114a.

Figure 8B:
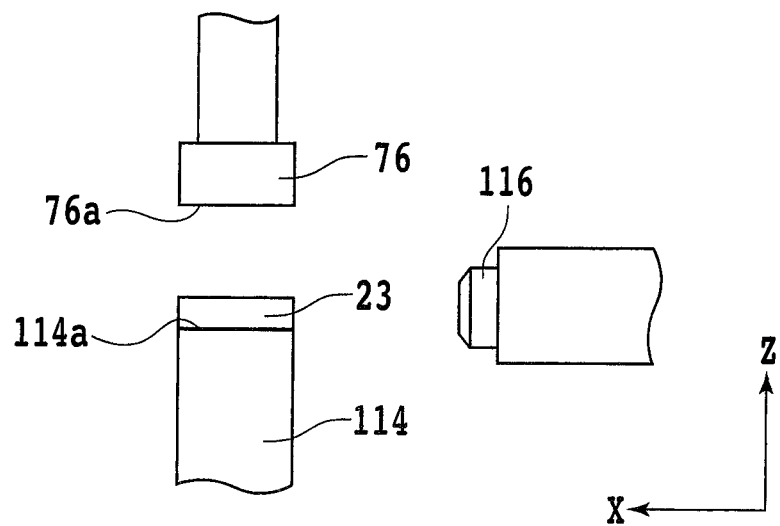
FIG. 8B is a front view of the imaging unit that images a side surface of the chip.

FIG. 8B is a front view of the side surface imaging unit 116 for imaging a side surface of the chip 23. As depicted in FIG. 8B, the chip 23 picked up by the collet 76 is disposed on the support surface 114a of the chip support base 114. Note that in the testing apparatus 2, the chip support base 114 is provided in a region overlapping with the moving route of the collet 76, and, therefore, the chip 23 can be disposed on the chip support base 114 by the collet 76. Then, one side surface of the chip 23 supported by the chip support base 114 is imaged by the side surface imaging unit 116. Thereafter, the chip support base 114 is rotated a predetermined angle, after which the other side surface of the chip 23 is imaged by the side surface imaging unit 116. In this way, the side surfaces of the chip 23 (for example, the side surfaces at the four sides of the chip 23) are observed, and the thickness of the chip 23, the size of chipping formed in the chip 23, and the like are measured. In addition, by controlling the rotational angle of the chip support base 114, the orientation (angle) in horizontal directions of the chip 23 at the time when the chip 23 is disposed on a strength measuring mechanism 200 (see FIGS. 1 and 2) can be controlled.

By the lower surface observation mechanism 102 and the side surface observation mechanism 112 described above, the lower surface and the side surfaces of the chip 23 picked up by the collet 76 are observed. Note that the side surface imaging unit 116 for imaging the side surfaces of the chip 23 may be provided at such a position as to be able to image the side surface of the chip 23 (see FIG. 8A) in the state of being held by the collet 76. In this case, the side surfaces of the chip 23 can be observed without supporting the chip 23 by the chip support base 114 (see FIG. 8B), and, therefore, it is possible to prevent the lower surface side of the chip 23 from being damaged due to disposing the chip 23 on the chip support base 114. In addition, the testing apparatus 2 may include only one of the lower surface observation mechanism 102 and the side surface observation mechanism 112, or may include neither of the lower surface observation mechanism 102 and the side surface observation mechanism 112, according to necessity for observation of the chip 23 after picking-up.

In the case of observing a processing mark (aforementioned saw mark, etc.) formed in the lower surface of the chip 23 by the lower surface observation mechanism 102, it is preferable that the lower surface imaging unit 108 possessed by the lower surface observation mechanism 102 can detect minute ruggedness (projection and recess) in the lower surface of the chip 23. Therefore, the lower surface imaging unit 108 includes, for example, an interferometer having an interference objective lens, or the like.

Figure 9A:
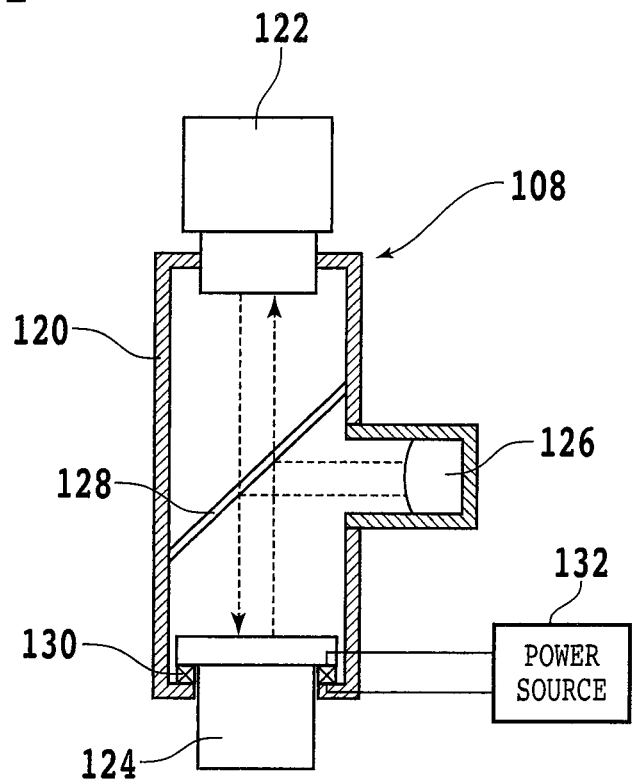
FIG. 9A is a partly sectional front view of the imaging unit of the lower surface observation mechanism.

FIG. 9A is a partly sectional front view of the lower surface imaging unit 108 of the lower surface observation mechanism 102. The lower surface imaging unit 108 includes an imaging element 122 provided at an upper portion of a box-shaped housing 120, and an interference objective lens 124 provided at a lower portion of the housing 120. In addition, a light applying section 126 including a white LED or the like, and a half-mirror 128 disposed between the imaging element 122 and the interference objective lens 124, are provided inside the housing 120. The light applying section 126 is disposed such as to be able to apply light toward the half-mirror 128. In addition, a piezoelectric element 130 whose length varies according to a voltage supplied from a power source 132 is provided between the housing 120 and the interference objective lens 124. By controlling the voltage supplied from the power source 132 to the piezoelectric element 130, the position (height) in the Z-axis direction of the interference objective lens 124 is controlled.

Figure 9B:
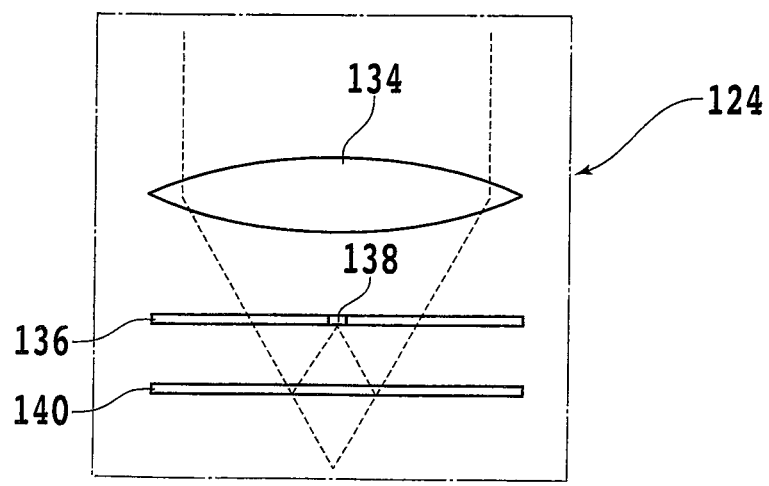
FIG. 9B is a schematic drawing depicting a structure of an interference objective lens.

FIG. 9B is a schematic drawing depicting the structure of the interference objective lens 124. The interference objective lens 124 includes an objective lens 134, a reference mirror 138 provided on a glass plate 136, and a half-mirror 140. The reference mirror 138 is disposed at a position symmetric with the focal position of the objective lens 134 with reference to the half-mirror 140. While light emitted from the light applying section 126 is reflected by the half-mirror 128, and is incident on the interference objective lens 124. Then, the light transmitted through the half-mirror 140 and reflected by the lower surface of the chip 23 and the light reflected by the half-mirror 140 and the reference mirror 138 interfere with each other. The light obtained by the interference is detected by the imaging element 122.

In the light obtained by the interference, an interference fringe according to the distance between the interference objective lens 124 and the lower surface of the chip 23 is generated. Based on the intensity of the interference fringe, minute ruggedness (projection and recess) in the lower surface of the chip 23 is detected. Note that while a Mirau type interference objective lens 124 is illustrated in FIG. 9B, the structure of the interference objective lens 124 is not limited. For example, the lower surface imaging unit 108 may include a Michelson type or Linnik type interference objective lens.

The accuracy of imaging by the lower surface imaging unit 108 including the interference objective lens 124 is susceptible to influence of vibration of the testing apparatus 2. Therefore, as illustrated in FIG. 7B, it is preferable that the vibration isolating section 110 is provided to restrain transmission of vibration from the base 4 to the lower surface imaging unit 108, and that the first support section 74a and the second support section 74b of the arm 74 are separated to prevent the vibration of the first support section 74a from being transmitted to the collet 76. On the other hand, the side surface observation mechanism 112 is used for measurement of the size of chipping formed in the chip 23, the thickness of the chip 23 and the like, and is not required to be as high as the lower surface observation mechanism 102 in measurement accuracy. Therefore, an optical microscope, for example, is mounted on the side surface imaging unit 116 possessed by the side surface observation mechanism 112.

In addition, a chip inverting mechanism 150 for inverting the chip 23 upside down is provided on an upper side of the chip support base 114 of the side surface observation mechanism 112 illustrated in FIGS. 1 and 2. The chip inverting mechanism 150 is configured to be 180° rotatable around a rotational axis substantially parallel to the X-axis direction in the state of holding the chip 23 by a tip portion thereof.

Figure 10A:
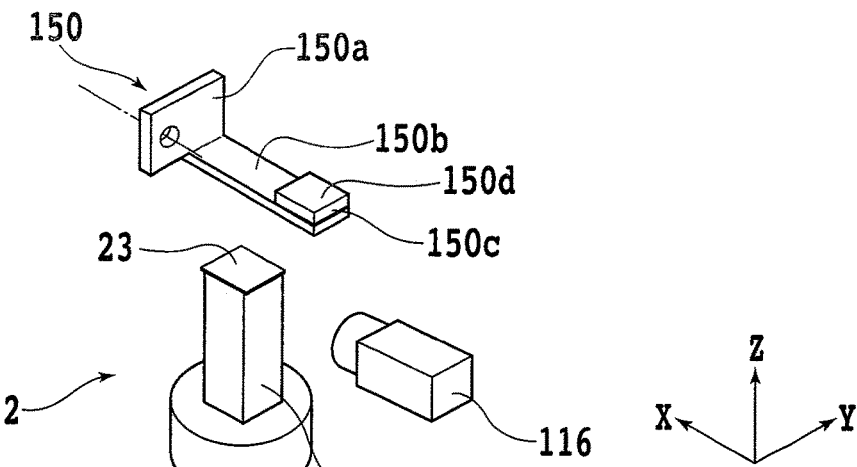
FIG. 10A is a perspective view of a chip inverting mechanism.

FIG. 10A is a perspective view of the chip inverting mechanism 150. The chip inverting mechanism 150 includes a plate-shaped base section 150a disposed substantially in parallel to the Y-axis direction and the Z-axis direction, and a plate-shaped connection section 150b disposed to extend along the X-axis direction from a side surface of the base section 150a toward the chip support base 114 and the side surface imaging unit 116 side. A rectangular chip holding section 150c projecting upward from an upper surface of the connection section 150b is provided at a tip portion of the connection section 150b. The chip holding section 150c is formed in a rectangular shape corresponding to the shape of the chip 23, and its upper surface constitutes a holding surface 150d for suction holding the chip 23. The base section 150a is configured to be 180° rotatable around a rotational axis which is substantially parallel to the X-axis direction. In addition, the chip holding section 150c is formed at such a position as to face (as to overlap with) the support surface 114a of the chip support base 114 when the base section 150a is rotated and the chip holding section 150c is disposed on a lower side of the connection section 150b (see FIG. 10B).

Figure 10B:
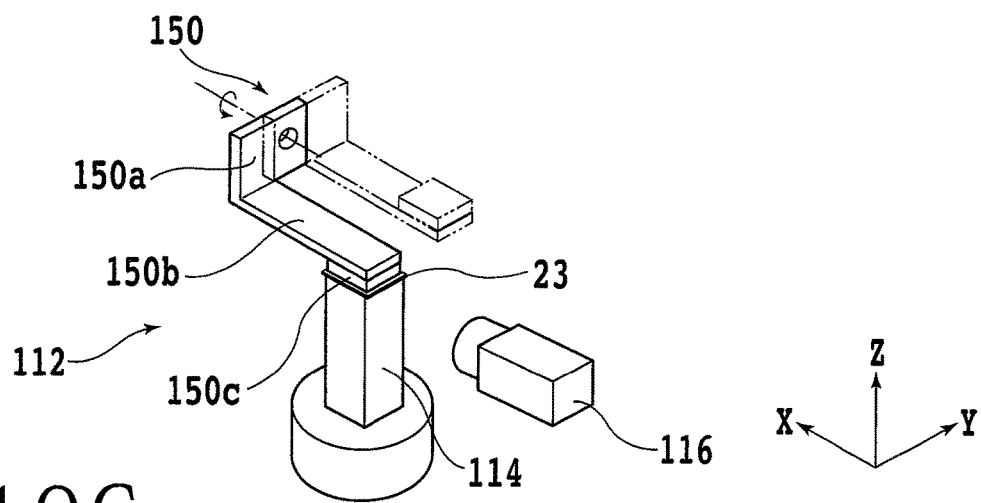
FIG. 10B is a perspective view depicting the chip inverting mechanism holding the chip.
Figure 10C:
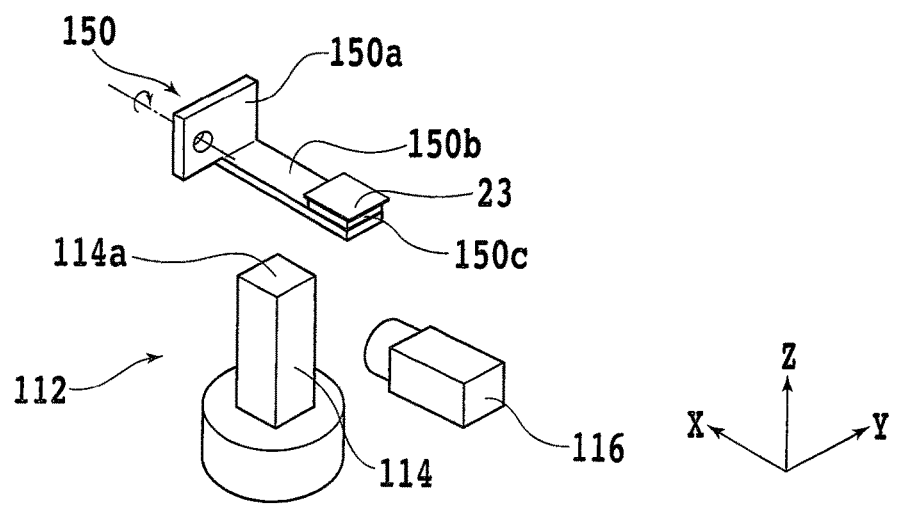
FIG. 10C is a perspective view depicting the chip inverting mechanism in a state in which the chip is inverted.

At the time of inverting the chip 23 upside down, first, the base section 150a is rotated 180° in a first direction (counterclockwise as viewed from the side surface imaging unit 116 side), to invert the chip inverting mechanism 150 upside down. As a result, the chip holding section 150c faces the chip 23 supported by the chip support base 114, and makes contact with the upper surface of the chip 23. Then, a negative pressure is made to act on the holding surface 150d of the chip holding section 150c, whereby the chip 23 is suction held by the chip holding section 150c. FIG. 10B is a perspective view of the chip inverting mechanism 150 holding the chip 23. Next, in the state in which the chip 23 is held by the chip holding section 150c, the base section 150a is rotated 180° in a second direction (clockwise as viewed from the side surface imaging unit 116 side), to invert the chip inverting mechanism 150 upside down. As a result, the lower surface side (corresponding to the back surface 13b side of the wafer 13) of the chip 23 is exposed to the upper side, and the chip 23 is inverted upside down. FIG. 10C is a perspective view depicting the chip inverting mechanism 150 in a state in which the chip 23 is inverted. Then, the lower surface side of the chip 23 exposed to the upper side is held by the collet 76. As a result, the chip 23 can be conveyed to the strength measuring mechanism 200 described later, in a state in which the lower surface side of the chip 23 is directed to the upper side. In this way, the chip 23 to be conveyed to the strength measuring mechanism 200 is inverted upside down by the chip inverting mechanism 150.

Besides, as illustrated in FIGS. 1 and 2, the strength measuring mechanism (strength measuring means) 200 for measuring the strength of a chip is provided on the front side of the chip observation mechanism 100 and the chip inverting mechanism 150. The strength measuring mechanism 200 measures the bending strength (die strength) of the chip 23 by pressing the chip 23 supported by a support unit 206 to be described later.

The collet 76 holding the chip 23 pushed up by the pushing-up mechanism 50 is moved from a position for facing the pushing-up mechanism 50 to a position for facing the support unit 206 of the strength measuring mechanism 200 by the collet moving mechanism 80, and dispose the chip 23 on the support unit 206. Note that the lower surface observation mechanism 102 and the side surface observation mechanism 112 of the chip observation mechanism 100 are disposed in a region overlapping with the moving route of the collet 76 at the time when the collet 76 is moved from the position for facing the pushing-up mechanism 50 to the position for facing the support unit 206 of the strength measuring mechanism 200. Therefore, observation of the chip 23 by the chip observation mechanism 100 can be performed during when the chip 23 is conveyed from a position on the pushing-up mechanism 50 to the strength measuring mechanism 200.

Figure 11:
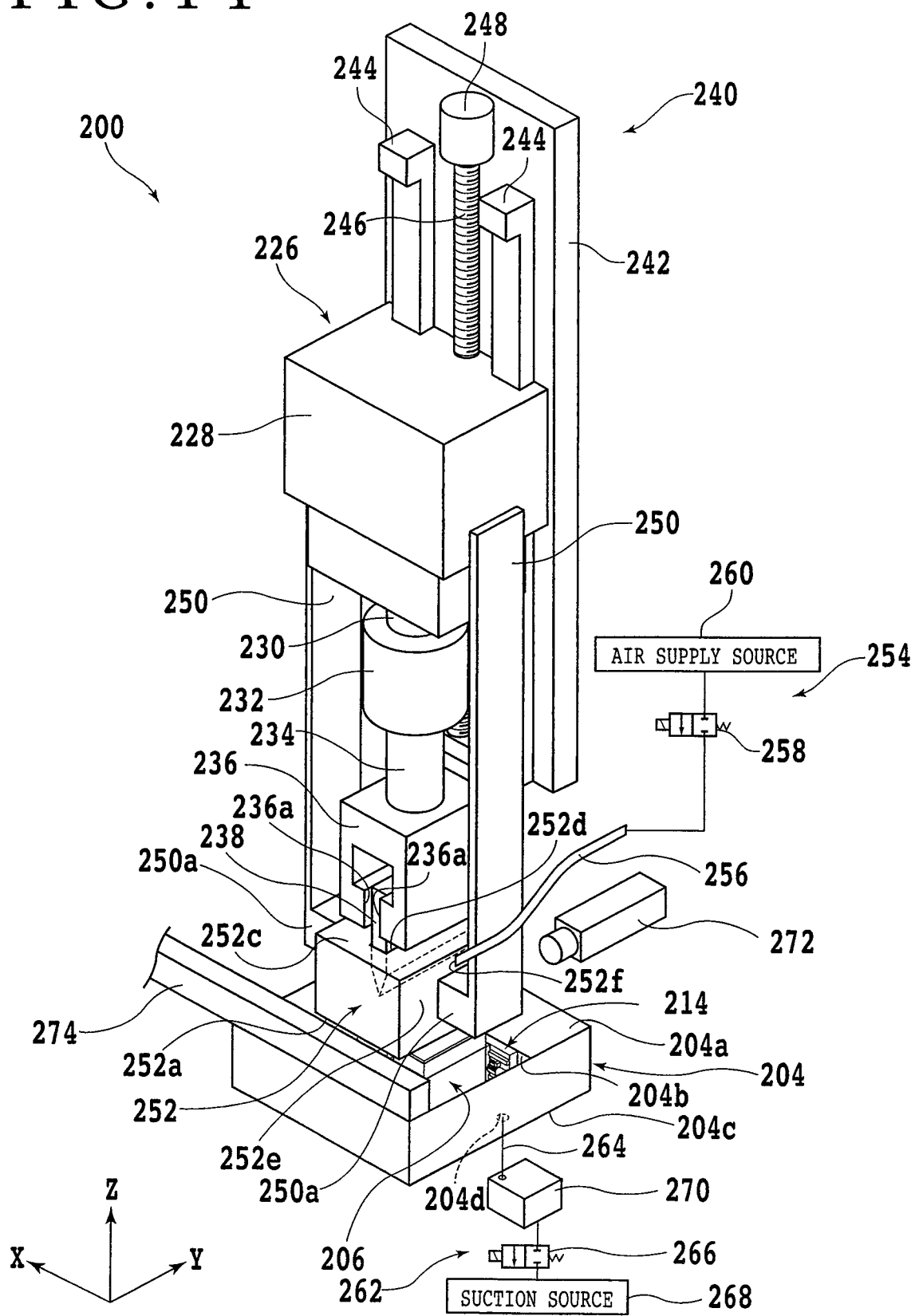
FIG. 11 is a perspective view of a strength measuring mechanism.

FIG. 11 is a perspective view of the strength measuring mechanism 200. The strength measuring mechanism 200 includes a box-shaped lower container (accommodation section) 204 formed in a rectangular parallelepiped shape. The lower container 204 is formed with a rectangular parallelepiped shaped opening 204b opening upward on an upper surface 204a side of the lower container 204. The support unit (support means) 206 for supporting the chip 23 whose strength is to be measured by the strength measuring mechanism 200 is provided inside the opening 204b. The chip 23 picked up by the collet 76 (see FIGS. 1 and 2) is disposed on the support unit 206.

Figure 12:
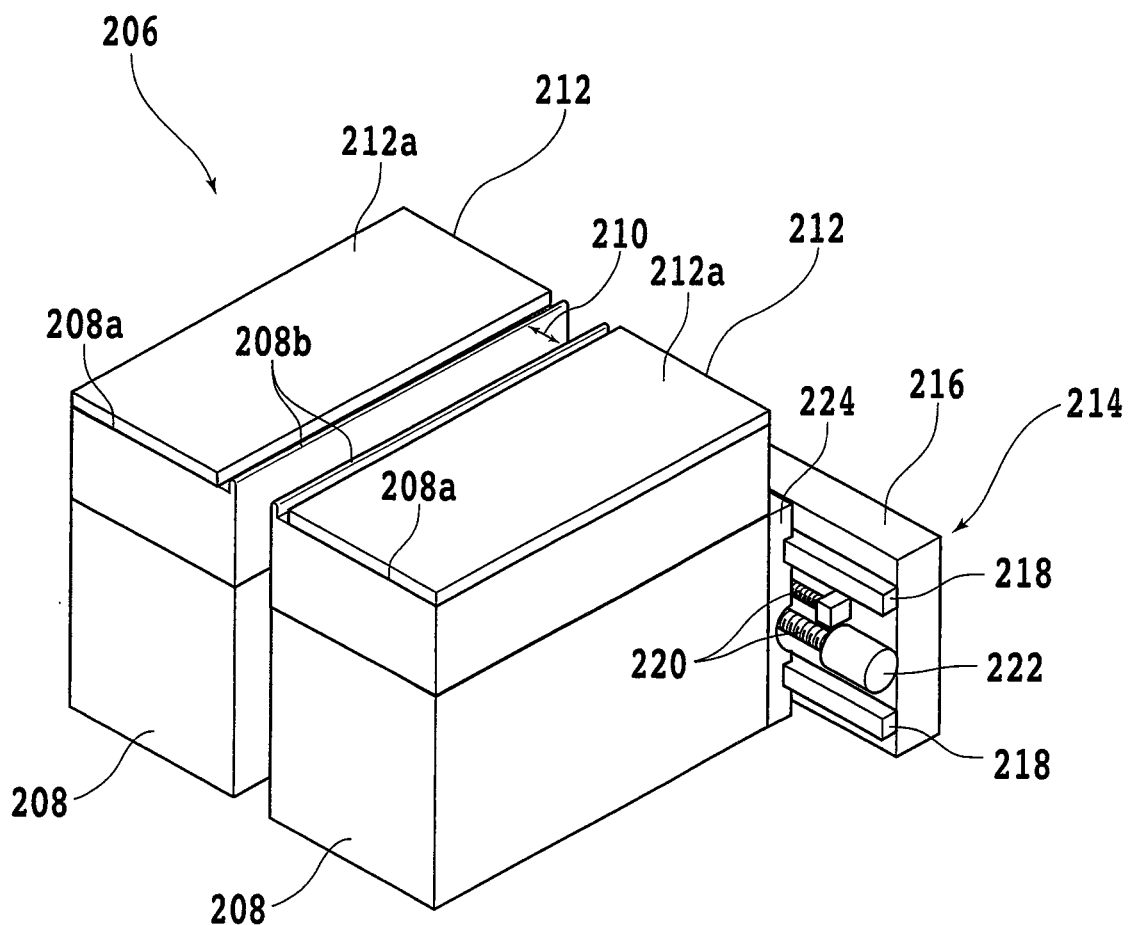
FIG. 12 is a perspective view of a support unit.

FIG. 12 is a perspective view of the support unit 206. The support unit 206 includes a pair of support bases 208 that support the chip 23. The pair of support bases 208 are each formed in a rectangular parallelepiped shape, and are disposed in the state of being spaced from each other such that a gap 210 is provided between the pair of support bases 208. In addition, the pair of support bases 208 are disposed such that the longitudinal direction of upper surfaces 208a thereof is along the Y-axis direction. The chip 23 whose strength is to be measured is disposed on the pair of support bases 208. Columnar (rod-shaped) support sections 208b projecting upward from the upper surfaces 208a of the pair of support bases 208 are formed on the upper surface 208a side of the pair of support bases 208. The support sections 208b are configured using, for example, a metal such as stainless steel, and are disposed adjacently to the gap 210 such that their longitudinal direction is along the Y-axis direction. The pair of support sections 208b are disposed in the state of being spaced from each other with the gap 210 interposed therebetween, and support the lower surface side of the chip 23. Note that the support sections 208b whose upper surfaces are formed as curved surfaces are illustrated in FIG. 12.

In addition, plate-shaped contact members 212 configured using a material (rubber sponge, etc.) more flexible than the support sections 208b are provided respectively on the upper surface 208a side of the pair of support bases 208. The pair of contact members 212 are formed in a rectangular shape in plan view, and are provided on both sides of the pair of support sections 208b. In other words, the contact members 212 are disposed on the opposite sides of the support sections 208b from the gap 210, and the pair of support sections 208b are disposed between the pair of contact members 212. The upper surfaces of the contact members 212 constitute contact surfaces 212a that make contact with the chip 23 and support the chip 23. Note that the contact members 212 are provided such that their contact surfaces 212a are disposed above the upper ends of the support sections 208b (for example, approximately 1 mm above the upper ends of the support sections 208b). When the chip 23 is placed on the pair of support bases 208, therefore, the lower surface side of the chip 23 does not make contact with the support sections 208b, but makes contact with the contact surfaces 212a of the contact members 212. Note that the details of the contact between the support sections 208b and the contact members 212 and the chip 23 will be described later (see FIGS. 14, 15, and 16).

A support base moving mechanism (support base moving means) 214 that moves the pair of support bases 208 along the X-axis direction is provided on the back surface side (front side of the testing apparatus 2) of the pair of support bases 208. The support base moving mechanism 214 includes a rectangular parallelepiped shaped support structure 216, and a pair of guide rails 218 are fixed at a predetermined spacing and along the X-axis direction, on the front surface side (rear surface side of the testing apparatus 2) of the support structure 216. Between the pair of guide rails 218, a pair of ball screws 220 are provided which are disposed substantially in parallel to the pair of guide rails 218. Pulse motors 222 for rotating the pair of ball screws 220 are connected to one-side end portions of the ball screws 220, respectively.

Further, the support base moving mechanism 214 includes a pair of moving plates 224 which are fixed to the back surface side of the pair of support bases 208, respectively. The moving plates 224 are slidably mounted to the pair of guide rails 218 provided on the front surface side of the support structure 216. In addition, the pair of moving plates 224 are provided with nut sections (not illustrated) on the back surface side thereof. The nut section provided in one of the pair of moving plates 224 is in screw engagement with one of the pair of ball screws 220, whereas the nut section provided in the other of the pair of moving plates 224 is in screw engagement with the other of the pair of ball screws 220. When the ball screw 220 is rotated by the pulse motor 222, the moving plate 224 in screw engagement with the ball screw 220 is moved in the X-axis direction along the guide rails 218. By this, the positions of the pair of support bases 208 in the X-axis direction and the width of the gap 210 are controlled.

Note that the shape, size and the like of the lower container 204 and the opening 204b illustrated in FIG. 11 are not limited, but are appropriately modified according to the shape, size and the like of the support unit 206 and the support base moving mechanism 214.

A pressing unit 226 is provided on an upper side of the lower container 204. The pressing unit 226 presses the chip 23 supported by the support unit 206, and measures the load exerted on the pressing unit 226 at the time of pressing the chip 23.

Figure 13:
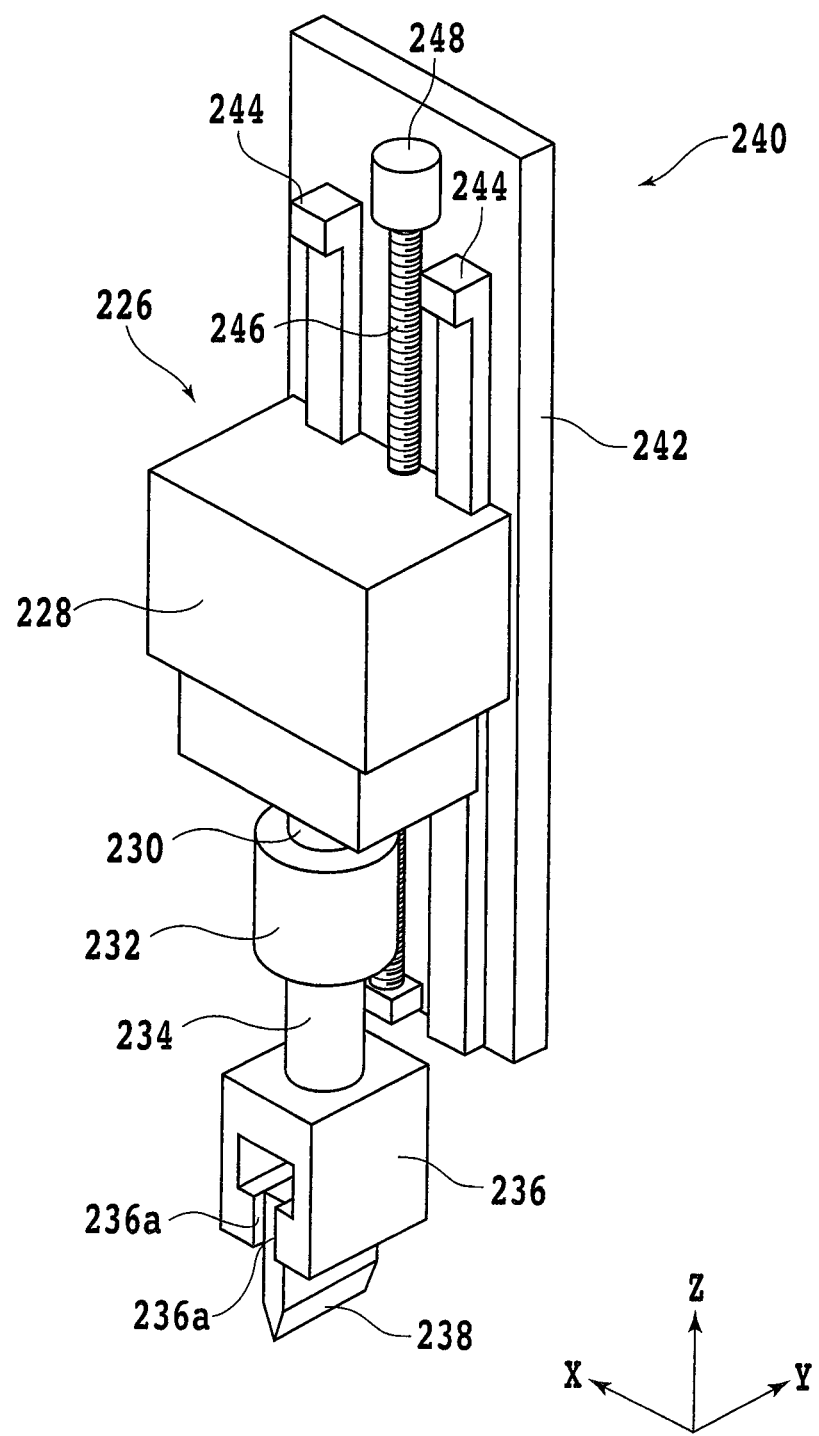
FIG. 13 is a perspective view of a pressing unit.

FIG. 13 is a perspective view of the pressing unit 226. The pressing unit 226 includes a moving base 228 connected to a moving mechanism (moving means) 240. A cylindrical first support member 230 disposed to extend downward from a lower surface of the moving base 228 is connected to the lower surface side of the moving base 228, and a load measuring unit (load measuring means) 232 including a load cell or the like is fixed to a lower end side of the first support member 230. A clamping member 236 is connected to the lower side of the load measuring unit 232 through a cylindrical second support member 234. The clamping member 236 is formed in a substantially gate-like shape in front view, and includes a pair of clamping surfaces 236a facing each other. An indenter 238 that presses the chip 23 supported by the support unit 206 is fixed between the pair of clamping surfaces 236a.

A tip portion (lower end portion) of the indenter 238 is formed in a tapered shape gradually decreasing in width toward the lower side. In other words, both side surfaces of the tip portion of the indenter 238 are inclined relative to the vertical direction. Besides, the tip (lower end) of the indenter 238 is formed in a rounded shape (R shape) (see FIG. 14). It is to be noted, however, that the shape of the indenter 238 is not limited to the above-mentioned. In addition, the indenter 238 is supported by the clamping member 236 such that its lower end is along the Y-axis direction. In other words, the lower end of the indenter 238 and the pair of support sections 208b (see FIG. 12) possessed by the support unit 206 are disposed substantially in parallel to each other.

In addition, a moving mechanism 240 that moves the pressing unit 226 along the Z-axis direction is provided on the back surface side (front surface side of the testing apparatus 2) of the pressing unit 226. The moving mechanism 240 includes a rectangular parallelepiped shaped support structure 242, and a pair of guide rails 244 are fixed at a predetermined spacing therebetween and along the Z-axis direction, on the front surface side (rear surface side of the testing apparatus 2) of the support structure 242. Between the pair of guide rails 244, a ball screw 246 is provided which is disposed substantially in parallel to the pair of guide rails 244. A pulse motor 248 for rotating the ball screw 246 is connected to one end portion of the ball screw 246.

The back surface side of the moving base 228 of the pressing unit 226 is slidably mounted to the pair of guide rails 244. In addition, the moving base 228 is provided with a nut section (not illustrated) on the back surface side thereof, and the nut section is in screw engagement with the ball screw 246. When the ball screw 246 is rotated by the pulse motor 248, the moving base 228 is moved in the Z-axis direction along the guide rails 244. By this, the position of the pressing unit 226 in the Z-axis direction is controlled. Besides, by moving the pressing unit 226 along the Z-axis direction by the moving mechanism 240, the indenter 238 is brought closer to and away from the support unit 206.

In addition, as illustrated in FIG. 11, a pair of connection members 250 formed in a plate-like shape are fixed on both side surfaces of the moving base 228. The connection members 250 are provided to extend downward from side surfaces of the moving base 228, and lower ends of the connection members 250 are disposed below the lower ends of the clamping members 236. The pair of connection members 250 are formed at their lower end portions with a pair of upper container support sections 250a projecting toward the indenter 238 side. Between the pair of upper container support sections 250a is fixed a rectangular parallelepiped shaped upper container (cover) 252 that covers a tip portion of the indenter 238. The upper container 252 is disposed on an upper side of the lower container 204, and both side surfaces thereof are supported by the pair of upper container support sections 250a.

The upper container 252 is configured using, for example, a transparent material (glass, plastic, etc.), and is formed in a box-like shape. The upper container 252 is formed with a rectangular parallelepiped shaped opening 252b (see FIG. 14) opening toward the lower side on a lower surface 252a side of the upper container 252. Besides, an indenter insertion hole 252d is formed on an upper surface 252c side of the upper container 252, and a tip portion of the indenter 238 is inserted in the indenter insertion hole 252d. Therefore, the tip portion of the indenter 238 is covered by the upper container 252. Note that in FIG. 11, part of the indenter 238 covered by the upper container 252 is depicted in broken lines. The upper container 252 is formed in such a size as to be insertable in the opening 204b of the lower container 204, and is disposed inside the opening 204b of the lower container 204 in plan view. In addition, the opening 252b (see FIG. 14) of the upper container 252 is formed in such a size as to be able to accommodate the support unit 206. Therefore, when the pressing unit 226 is moved downward by the moving mechanism 240, the upper container 252 is inserted into the opening 204b of the lower container 204, and the upper side of the support unit 206 is covered by the upper container 252.

Besides, a side wall 252e of the upper container 252 is provided with a nozzle insertion hole 252f. An air supply unit 254 for blowing air to a tip portion of the indenter 238 is connected to the nozzle insertion hole 252f. The air supply unit 254 includes a nozzle 256 for jetting air toward the indenter 238. One end side of the nozzle 256 is inserted into the inside of the upper container 252 via the nozzle insertion hole 252f, and the other end side of the nozzle 256 is connected to an air supply source 260 via a valve 258. In addition, a tip 256a (see FIG. 14) on one end side of the nozzle 256 is opening toward a side surface of the tip portion of the indenter 238. When air is blown to the side surface of the tip portion of the indenter 238 from the air supply source 260 via the valve 258 and the nozzle 256, foreign matter adhering to the tip portion of the indenter 238, the pair of support sections 208b, the contact surfaces 212a (see FIG. 12) and the like is removed. Note that details of an operation of the air supply unit 254 will be described later.

In addition, the lower container 204 is formed in its bottom portion with a debris discharge port 204d that penetrates from a bottom of the opening 204b of the lower container 204 to a lower surface (bottom surface) 204c of the lower container 204. A debris discharge unit 262 for discharging debris of the chip 23 present in the inside of the lower container 204 is connected to the debris discharge port 204d. The debris discharge unit 262 includes a debris discharge passage 264 constituting a route for discharging the debris of the chip 23. One end side of the debris discharge passage 264 is connected to the debris discharge port 204d, while the other end side of the debris discharge passage 264 is connected to a suction source 268 through a valve 266. Besides, a debris recovery section 270 for recovering the debris of the chip 23 is provided in the debris discharge passage 264. The debris recovery section 270 is configured using a filter or the like, and captures the debris of the chip 23 passing through the debris discharge passage 264. When the valve 266 is opened, the debris of the chip 23 scattered in the inside of the opening 204b of the lower container 204 is sucked through the debris discharge port 204d, and is recovered in the debris recovery section 270. Note that details of an operation of the debris discharge unit 262 will be described later.

Besides, on the front and rear sides of the lower container 204, an imaging unit (camera) 272 and a light source 274 for illuminating light toward the imaging unit 272 are provided such as to face each other with an upper portion of the support unit 206 interposed therebetween. The positions of the imaging unit 272 and the light source 274 are controlled such that the chip 23 supported by the support unit 206, a tip portion of the indenter 238 and the like can be imaged by the imaging unit 272. By imaging the tip portion of the indenter 238 by the imaging unit 272 while illuminating light from the light source 274, the tip 23 being pressed by the indenter 238 and the state (the presence or absence of adhesion of foreign matter, the presence or absence of chipping, etc.) of the tip portion of the indenter 238 can be observed. It is to be noted, however, that in the case where imaging by the imaging unit 272 is conducted in a sufficiently light environment, the light source 274 may be omitted.

In addition, each of components of the strength measuring mechanism 200 is connected to a control section (not illustrated) that controls operations of the strength measuring mechanism 200. For example, operations of the support base moving mechanism 214, the load measuring unit 232, the moving mechanism 240, the air supply unit 254, the debris discharge unit 262, the imaging unit 272, the light source 274 and the like are controlled by the control section.

By using the above-mentioned strength measuring mechanism 200, a three-point bending test on the chip 23 can be performed. By the three-point bending test, bending strength (die strength) of the chip 23 is measured. An operation example of the strength measuring mechanism 200 at the time of measuring the strength of the chip 23 will be described below.

Figure 14:
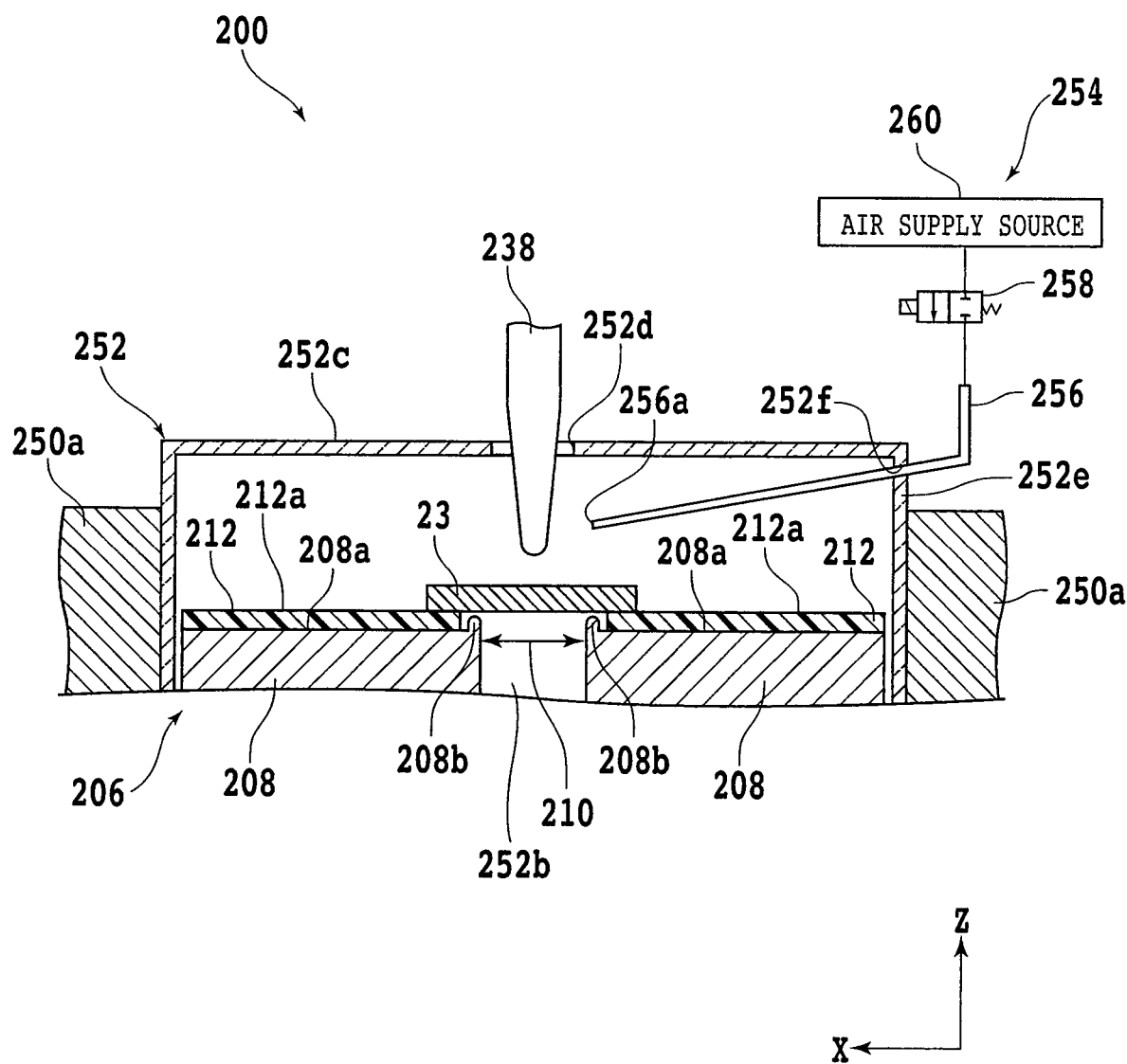
FIG. 14 is a sectional view depicting the strength measuring mechanism in a state in which the chip is supported by the support unit.

FIG. 14 is a sectional view depicting the strength measuring mechanism 200 in a state in which the chip 23 is supported by the support unit 206. As illustrated in FIG. 14, the indenter 238 is disposed on an upper side of the pair of support sections 208b such as to overlap with a region (gap 210) between the pair of support sections 208b. In addition, the indenter 238 is disposed such that its tip (lower end) lies along the length direction of the support sections 208b (Y-axis direction).

When measuring the strength of the chip 23, first, the positions of the pair of support bases 208 in the X-axis direction are controlled by the support base moving mechanism 214 (see FIG. 12). The positions of the pair of support bases 208 are controlled according to the size of the chip 23 and the like, in such a manner that the gap 210 of an appropriate width is formed. Thereafter, the chip 23 is placed on the pair of support bases 208. Specifically, in a state in which the chip 23 held by the collet 76 (see FIGS. 1 and 2) is positioned on the pair of support bases 208, suction of the chip 23 by the collet 76 is released. In this instance, the chip 23 is disposed in such a manner that both end portions thereof are supported by the pair of support bases 208 and a central portion thereof overlaps with the gap 210.

Note that if the lower surface side makes contact with the support section 208b when the chip 23 is placed on the pair of support bases 208, the lower surface side of the chip 23 may be damaged by the shock at the time of placement. In this case, the strength of the chip 23 may change, and it may be difficult to measure the strength of a plurality of chips 23 under the same conditions. Here, in the present embodiment, the contact members 212 configured using a flexible material are provided on the upper surface 208a side of the support bases 208, and the contact surfaces 212a of the contact members 212 are located above the upper ends of the support sections 208b. Therefore, when the chip 23 is placed on the pair of support bases 208, the chip 23 does not make contact with the support sections 208b but makes contact with the contact surfaces 212a of the contact members 212, and is supported by the contact surfaces 212a. As a result, the lower surface side of the chip 23 can be prevented from being damaged by making contact with the support sections 208b when the chip 23 is placed, and change in the strength of the chip 23 is restrained.

Figure 15:
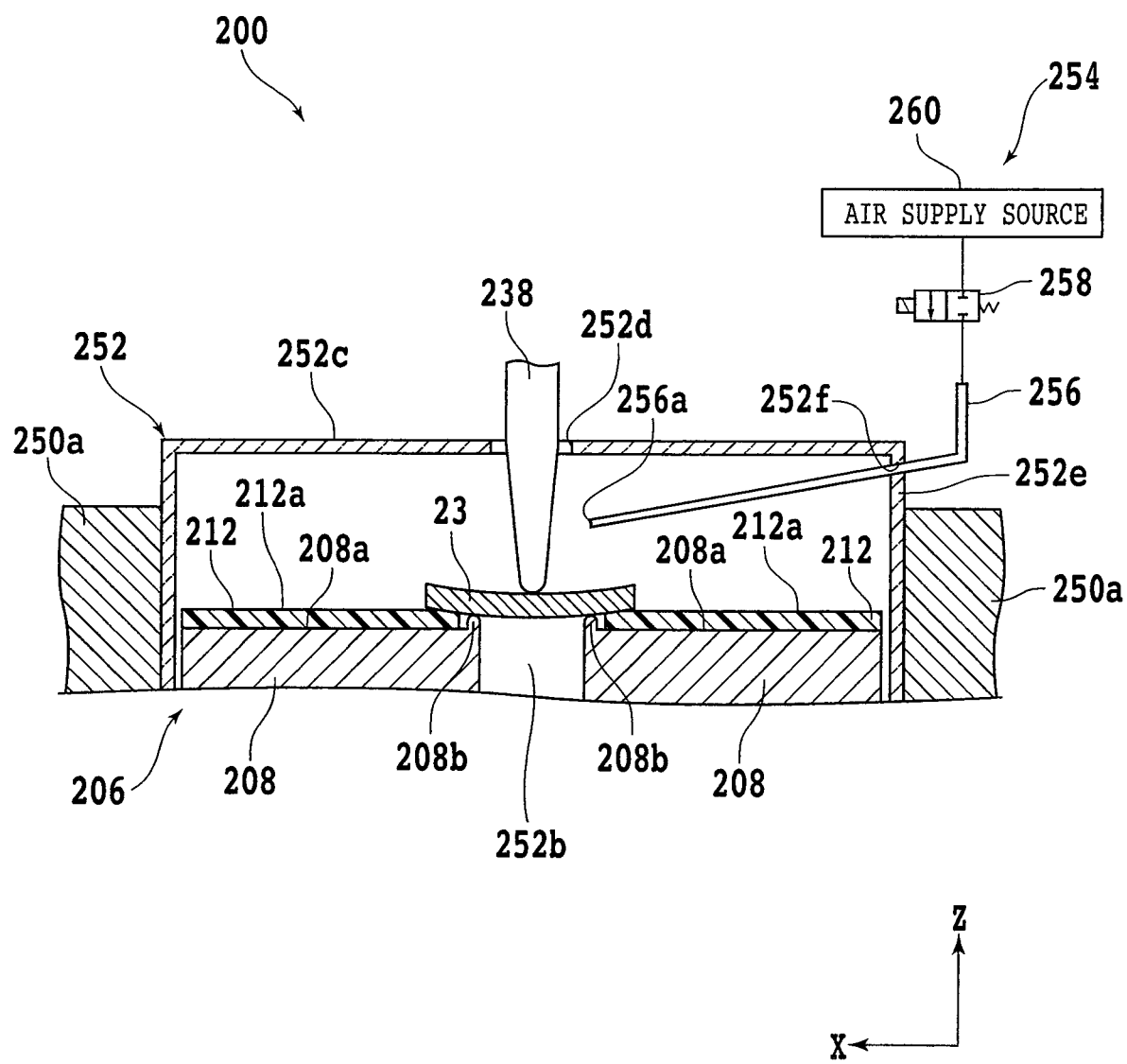
FIG. 15 is a sectional view depicting the strength measuring mechanism in a state in which the chip makes contact with a support section of a support base.

Next, the pressing unit 226 is lowered by the moving mechanism 240 (see FIG. 13). When the pressing unit 226 is gradually lowered, the tip of the indenter 238 makes contact with the upper surface side of the chip 23, and the chip 23 is pressed by the indenter 238. In addition, the load (force in the Z-axis direction) exerted on the indenter 238 by the pressing of the chip 23 is measured by the load measuring unit 232 (see FIG. 13). When the pressing unit 226 is further lowered, the chip 23 is further pressed by the indenter 238, and the contact members 212 supporting the chip 23 are deformed and the chip 23 is bent. As a result, the lower surface side of the chip 23 makes contact with the support sections 208b of the support bases 208. Note that in this instance, depending on the flexibility of the contact members 212, only deformation of the contact members 212 may be generated and bending of the chip 23 may not be generated. FIG. 15 is a sectional view depicting the strength measuring mechanism 200 in a state in which the chip 23 is in contact with the support sections 208b of the support bases 208. When the chip 23 makes contact with the pair of support sections 208b, the chip 23 is supported by the pair of support sections 208b, and the load exerted on the indenter 238 pressing the chip 23 increases.

Figure 16:
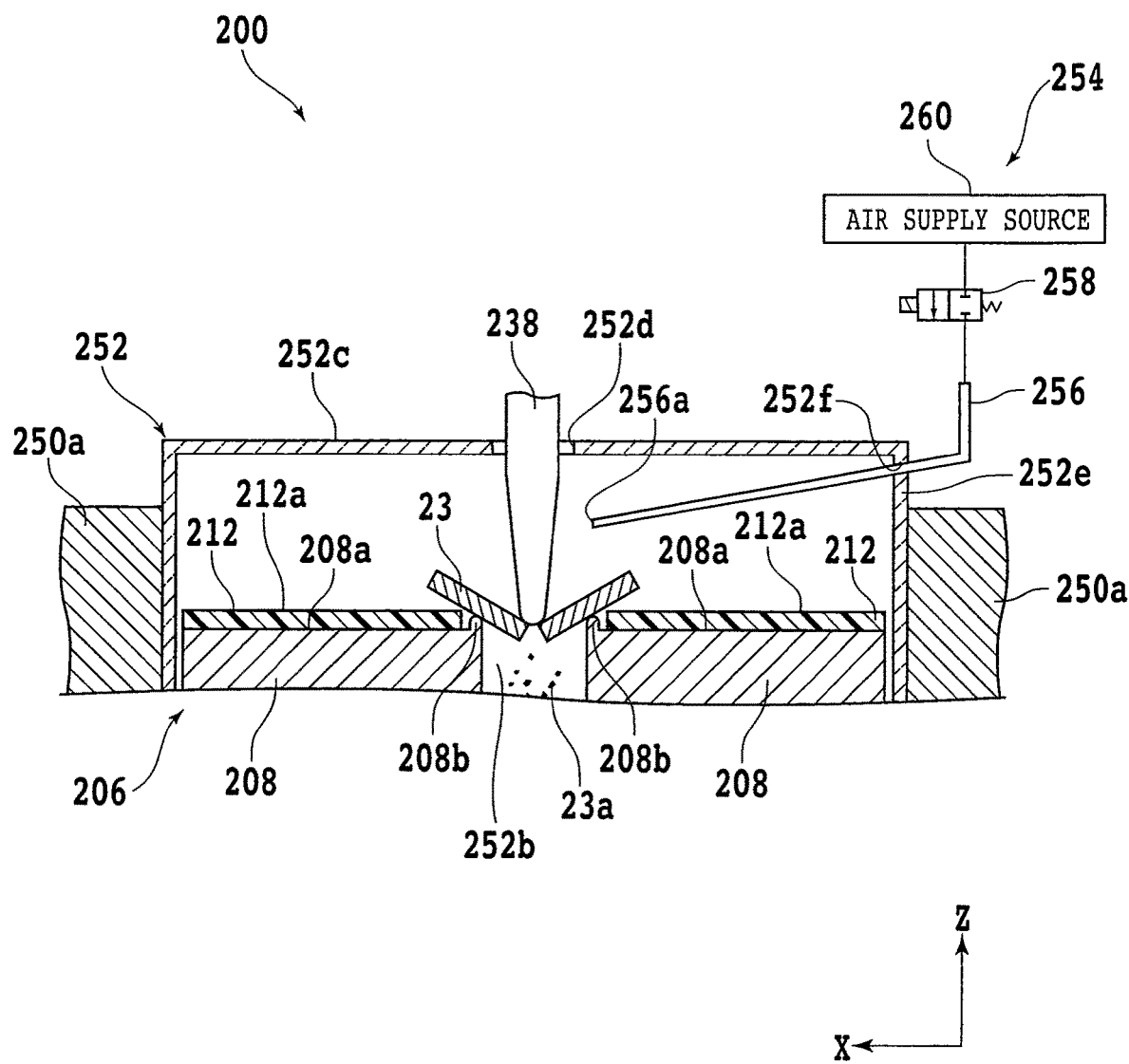
FIG. 16 is a sectional view depicting the strength measuring mechanism in a state in which the chip is broken.

When the pressing unit 226 is lowered further, the chip 23 is pressed further by the indenter 238 in the state of being supported by the pair of support sections 208b, and the chip 23 is bent. Then, when the pressing force exerted on the chip 23 from the indenter 238 exceeds a predetermined value, the chip 23 is broken. FIG. 16 is a sectional view depicting the strength measuring mechanism 200 in a state in which the chip 23 is broken. When the chip 23 is broken, the load measured by the load measuring unit 232 decreases from a maximum value to zero. Therefore, the timing of breakage of the chip 23 can be detected from variation in the value of load measured by the load measuring unit 232. Besides, the maximum value of the load measured by the load measuring unit 232 corresponds to the strength of the chip 23. Specifically, the bending stress value of the chip 23 is calculated based on the maximum value of load exerted on the indenter 238, the distance between upper ends of the pair of support sections 208b, and the size of the chip 23. Let a maximum value of load exerted on the indenter 238 pressing the chip 23 be W [N], let a distance between the upper ends of the pair of support sections 208b be L [mm], let a width of the chip 23 (the length of the chip 23 in a direction (Y-axis direction) perpendicular to a straight line interconnecting the pair of support sections 208b) be b [mm], and let a thickness of the chip 23 be h [mm], then a bending stress $\sigma$ of the chip 23 is expressed as $\sigma=3WL/2bh^2$.

When the chip 23 is broken, debris 23a of the chip 23 is scattered. Here, when the chip 23 is pressed by the indenter 238, as illustrated in FIG. 16, the upper container 252 is positioned such as to cover the chip 23 and the upper side of the support unit 206. As a result, the debris 23a of the chip 23 is prevented from being scattered to the outside of the strength measuring mechanism 200. Since scattering of the debris 23a is prevented by the upper container 252, at the time of performing the test of the strength of the chip 23, the operator of the strength measuring mechanism 200 can omit wearing a protector such as goggles. As a result, lowering in visibility of the components (indenter 238, etc.) of the strength measuring mechanism 200 and the chip 23 due to the wearing of the protector is prevented.

Note that if the chip 23 is pressed by the indenter 238, foreign matter (debris 23a of the chip 23, etc.) may adhere to the indenter 238. Since the foreign matter may influence the accuracy of the test, it is preferable to remove the foreign matter. For this reason, after the test of the chip 23 is conducted, it is preferable to blow air to the indenter 238 by the air supply unit 254, thereby removing the foreign matter adhering to the indenter 238. Specifically, the valve 258 of the air supply unit 254 is opened, and air supplied from the air supply source 260 is jetted from the tip 256a of the nozzle 256 toward a side surface of the tip portion of the indenter 238. By this, the foreign matter adhering to the tip portion of the indenter 238 is blown off and removed. Note that the timing of removal of the foreign matter by use of the air supply unit 254 is not limited. For example, the removal of the foreign matter is carried out, as required, during the period after the test of one chip 23 is completed and before the test of the next chip 23 is performed. In addition, the air jetted toward the tip portion of the indenter 238 flows inside the upper container 252, and is blown also onto the pair of support bases 208. As a result, the foreign matter (debris 23a of the chip 23, etc.) adhering to the support sections 208b and the contact surfaces 212a of the contact members 212 is blown off by the air and removed. Consequently, when the next test is performed, damaging of the chip 23 due to the contact of the foreign matter with the lower surface side of the chip 23 can be prevented.

Note that where the tip 256a of the nozzle 256 is disposed toward the upper surfaces 208a of the support bases 208, the air jetted from the nozzle 256 is strongly blown to the upper surface 208a side of the support bases 208. In this case, the foreign matter adhering to the support sections 208b and the contact members 212 may be blown off by the air to soar inside the upper container 252 and may then adhere again to the support sections 208b and the contact members 212. For this reason, it is difficult for the foreign matter to be suitably removed from the upper surface 208a side of the support bases 208. In the strength measuring mechanism 200 according to the present embodiment, on the other hand, the tip 256a the nozzle 256 is opening toward the side surface of the tip portion of the indenter 238, and, therefore, the vigor of the air blown to the upper surfaces 208a of the support bases 208 is appropriately weakened. Consequently, the foreign matter is suitably removed from the upper surface 208a side of the support bases 208.

When the test of the chip 23 and the removal of foreign matter by the air supply unit 254 are repeated, debris 23a of the chip 23 is accumulated in the inside of the lower container 204. In view of this, in the present embodiment, the debris 23a accumulated inside the lower container 204 is recovered by use of the debris discharge unit 262 (see FIG. 11). Specifically, the valve 266 of the debris discharge unit 262 is opened, and the debris 23a accumulated in the inside of the opening 204b of the lower container 204 is sucked via the debris discharge port 204d provided in the bottom of the opening 204b. The thus sucked debris 23a is passed through the debris discharge passage 264, to be recovered by the debris recovery section 270. Thus, when the debris discharge unit 262 is used, the debris 23a can be swiftly removed, without manually cleaning the inside of the opening 204b of the lower container 204. Note that in the strength measuring mechanism 200, the upper container 252 is formed to be smaller than the opening 204b of the lower container 204, and the upper container 252 is formed with the indenter insertion hole 252d in which to insert the indenter 238, and the like. Therefore, even when the upper container 252 is lowered toward the lower container 204, the opening 204b of the lower container 204 is not hermetically closed by the upper container 252. Consequently, when the debris 23a of the chip 23 is sucked via the debris discharge port 204d, outside air is easily taken into the opening 204b, and the suction of the debris 23a of the chip 23 can be performed smoothly.

Besides, as illustrated in FIGS. 1 and 2, a touch panel type monitor 300 serving as a user interface is provided on the front side of the strength measuring mechanism 200. The monitor 300 functions as a display section (display means) for displaying such information as the operating state of the testing apparatus 2 and test results, and functions also as an input section (input means) through which the operator inputs test conditions and the like to the testing apparatus 2.

As above-mentioned, in the testing apparatus 2 according to the present embodiment, it is possible, by picking up a predetermined chip 23 included in the wafer 13 by the collet 76 and moving the collet 76 by the collet moving mechanism 80, to place the chip 23 on the support unit 206 of the strength measuring mechanism 200. Therefore, the strength of the chip 23 can be measured, without manually performing the pick-up of the chip 23 and the placement of the chip 23 onto the strength measuring mechanism 200. Consequently, the test of the chip 23 can be facilitated, and lowering in the accuracy of the test due to variations in the picking-up operation or placement of the chip 23 and the like can be prevented.

Note that while an example in which the strength of the chip 23 is measured by the three-point bending test conducted using the strength measuring mechanism 200 has been described above, the contents of the test conducted using the strength measuring mechanism 200 can be changed appropriately. For example, the strength measuring mechanism 200 may perform the test of the strength of the chip 23 by a ball rupturing test or a four-point bending test. When a ball rupturing test is conducted by the strength measuring mechanism 200, the strength measuring mechanism 200 includes a spherical indenter for pressing the chip 23. The indenter is brought into contact with a predetermined point of the chip 23, whereby the chip 23 is pressed. In addition, when the four-point bending test is performed by the strength measuring mechanism 200, the strength measuring mechanism 200 includes a pair of indenters disposed along the pair of support sections 208b (see FIG. 12). The pair of indenters are put into contact with a predetermined region of the chip 23, whereby the chip 23 is pressed. In the cases of performing the ball rupturing test or the four-point being test, also, the upper container 252 of the strength measuring mechanism 200 is positioned such as to cover the chip 23 when the indenter or indenters press the chip 23. Therefore, scattering of the debris 23a generated when the chip 23 is broken is prevented.

Other than the aforementioned, the structures, methods and the like according to the above-described embodiment can be modified, as required, within the scope of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A testing apparatus for measuring a strength of a chip, the testing apparatus comprising:
    a cassette mounting base on which a cassette capable of accommodating wafer units is mounted, the wafer units each having a wafer divided into a plurality of chips, a tape adhered to the wafer, and an annular frame adhered to an outer peripheral portion of the tape and provided with an opening disposing the wafer inside thereof;
    a frame fixing mechanism that fixes the annular frame of the wafer unit;
    a conveying mechanism that conveys the wafer unit between the cassette and the frame fixing mechanism;
    a pushing-up mechanism that pushes up a predetermined chip included in the wafer supported by the annular frame fixed by the frame fixing mechanism;
    a pick-up mechanism having a collet that picks up the chip pushed up by the pushing-up mechanism;
    a strength measuring mechanism including a support unit that supports the chip picked up by the collet, an indenter that presses the chip supported by the support unit, a moving mechanism that relatively moves the indenter closer to and away from the support unit, and a load measuring unit that measures a load exerted on the indenter when the indenter presses the chip; and
    a collet moving mechanism that moves the collet from a position facing the pushing-up mechanism to a position facing the support unit of the strength measuring mechanism,
    wherein the collet moving mechanism includes:
    a Y-axis moving mechanism including a horizontally-extending guide rail that is configured and arranged for moving the pick-up mechanism having the collet horizontally in a Y-axis direction; and
    a Z-axis moving mechanism that is configured and arranged for moving the pick-up mechanism having the collet vertically in a Z-axis direction.

2. The testing apparatus according to claim 1, further comprising:
    a chip observation mechanism that has an imaging unit imaging the chip picked up by the collet and is disposed in a region overlapping with a moving route of the collet when the collet moves from the position facing the pushing-up mechanism to the position facing the support unit.

3. The testing apparatus according to claim 2,
    wherein the imaging unit has an interference objective lens and is disposed on a vibration isolating section restraining transmission of vibration to the imaging unit.

4. The testing apparatus according to claim 1, wherein the support unit of the strength measuring mechanism comprises:
- a first support base and a second support base that define a gap therebetween;
- a first contact member positioned on an upper surface of the first support base and a second contact member positioned on an upper surface of the second support member, wherein the first and second contact members are each made of material that is more flexible than the material of their associated support base; and
- a first columnar support section that projects upwardly from the first support base at a position adjacent to the gap and a second columnar member that projects upwardly from the second support base at a position adjacent to the gap,
- wherein an upper surface of the first contact member is disposed above an upper edge of the first columnar support section and an upper surface of the second contact member is disposed above an upper edge of the second columnar support section.

5. The testing apparatus according to claim 1, further comprising a positioning mechanism that moves the frame fixing mechanism in an X-axis direction and the Y-axis direction.

6. The testing apparatus according to claim 5, wherein the positioning mechanism comprises:
- a moving block that is configured and arranged to move in the X-axis direction on a pair of moving block guide rails to a position above the pushing-up mechanism, and wherein the frame fixing mechanism is supported by and is configured to move with the moving block.

7. A testing apparatus for measuring a strength of a chip, the testing apparatus comprising:
- a cassette mounting base on which a cassette capable of accommodating wafer units is mounted, the wafer units each having a wafer divided into a plurality of chips, a tape adhered to the wafer, and an annular frame adhered to an outer peripheral portion of the tape and provided with an opening disposing the wafer inside thereof;
- a frame fixing mechanism that fixes the annular frame of the wafer unit;
- a conveying mechanism that conveys the wafer unit between the cassette and the frame fixing mechanism;
- a pushing-up mechanism that pushes up a predetermined chip included in the wafer supported by the annular frame fixed by the frame fixing mechanism;
- a pick-up mechanism having a collet that picks up the chip pushed up by the pushing-up mechanism;
- a strength measuring mechanism including a support unit that supports the chip picked up by the collet, an indenter that presses the chip supported by the support unit, a moving mechanism that relatively moves the indenter closer to and away from the support unit, and a load measuring unit that measures a load exerted on the indenter when the indenter presses the chip;
- a collet moving mechanism that moves the collet from a position facing the pushing-up mechanism to a position facing the support unit; and
- a chip observation mechanism that has an imaging unit imaging the chip picked up by the collet and is disposed in a region overlapping with a moving route of the collet when the collet moves from the position facing the pushing-up mechanism to the position facing the support unit,
- wherein the imaging unit has an interference objective lens and is disposed on a vibration isolating section restraining transmission of vibration to the imaging unit, and
- wherein the pick-up mechanism includes an arm that connects the collet and the collet moving mechanism,
- the arm includes a first support section connected to the collet moving mechanism and a second support section to which the collet is fixed,
- the first support section and the second support section are connectable to and separable from each other,
- the chip observation mechanism includes a holding section that holds the second support section, and
- the imaging unit images the chip held by the collet in a state in which the second support section is separated from the first support section and is held by the holding section.

8. The testing apparatus according to claim 7, wherein the holding section of the chip observation mechanism is connected to a suction source, whereby the holding section of the chip observation mechanism is configured and arranged to hold the second support section via suction.

9. The testing apparatus according to claim 7, wherein the holding section of the chip observation mechanism and a lower surface of the second support section are configured and arranged to be held together by a magnetic force.

10. The testing apparatus according to claim 9, wherein the holding section of the chip observation mechanism includes a magnet and a lower surface of the second support section includes a magnetic material.

11. The testing apparatus according to claim 7, wherein the second support section of the arm of the pick-up mechanism is generally L-shaped and comprises a vertical extending leg with a lower end that has the collet attached thereto and a horizontal extending leg that is configured and arranged to be held by the holding section of the chip observation mechanism in the state in which the second support section has been separated from the first support section.

12. The testing apparatus according to claim 7, further comprising a positioning mechanism that moves the frame fixing mechanism between a first position and a position above the pushing-up mechanism.

13. The testing apparatus according to claim 12, wherein the positioning mechanism comprises:
- a moving block that is configured and arranged to move on a pair of moving block guide rails to the position above the pushing-up mechanism, and wherein the frame fixing mechanism is supported by and is configured to move with the moving block.

14. A testing apparatus for measuring a strength of a chip, the testing apparatus comprising:
- a cassette mounting base on which a cassette capable of accommodating wafer units is mounted, the wafer units each having a wafer divided into a plurality of chips, a tape adhered to the wafer, and an annular frame adhered to an outer peripheral portion of the tape and provided with an opening disposing the wafer inside thereof;
- a frame fixing mechanism that fixes the annular frame of the wafer unit;
- a conveying mechanism that conveys the wafer unit between the cassette and the frame fixing mechanism;
- a pushing-up mechanism that pushes up a predetermined chip included in the wafer supported by the annular frame fixed by the frame fixing mechanism;
- a pick-up mechanism having a collet that picks up the chip pushed up by the pushing-up mechanism;

a strength measuring mechanism including a support unit that supports the chip picked up by the collet, an indenter that presses the chip supported by the support unit, a moving mechanism that relatively moves the indenter closer to and away from the support unit, and a load measuring unit that measures a load exerted on the indenter when the indenter presses the chip; and a collet moving mechanism that moves the collet from a position facing the pushing-up mechanism to a position facing the support unit of the strength measuring mechanism, wherein the conveying mechanism is movably located between the frame fixing mechanism and the cassette and the collet moving mechanism is movably located between the pushing-up mechanism and the strength testing mechanism, whereby the conveying mechanism is spaced from and the collet moving mechanism.

15. The testing apparatus according to claim 14, further comprising a positioning mechanism that moves the frame fixing mechanism between a first position and a position above the pushing-up mechanism.

16. The testing apparatus according to claim 15, wherein the positioning mechanism comprises:

a moving block that is configured and arranged to move on a pair of moving block guide rails to the position above the pushing-up mechanism, and wherein the frame fixing mechanism is supported by and is configured to move with the moving block.

* * * * *